(12) United States Patent
Hirose et al.

(10) Patent No.: US 11,482,155 B2
(45) Date of Patent: Oct. 25, 2022

(54) RECEIVING CIRCUIT

(71) Applicant: Semiconductor Energy Laboratory Co., Ltd., Atsugi (JP)

(72) Inventors: Takeya Hirose, Atsugi (JP); Takahiro Fukutome, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 17/257,590

(22) PCT Filed: Jul. 10, 2019

(86) PCT No.: PCT/IB2019/055857
§ 371 (c)(1),
(2) Date: Jan. 4, 2021

(87) PCT Pub. No.: WO2020/016705
PCT Pub. Date: Jan. 23, 2020

(65) Prior Publication Data
US 2021/0272507 A1 Sep. 2, 2021

(30) Foreign Application Priority Data

Jul. 20, 2018 (JP) .............................. JP2018-136993

(51) Int. Cl.
*G09G 3/20* (2006.01)
*H03F 1/26* (2006.01)
(Continued)

(52) U.S. Cl.
CPC .............. *G09G 3/2092* (2013.01); *H03F 1/26* (2013.01); *H03F 3/45076* (2013.01); *H04B 3/02* (2013.01); *G09G 2310/0291* (2013.01)

(58) Field of Classification Search
CPC .......... G09G 3/2029; G09G 2310/0291; H03F 1/26; H03F 3/45076; H04B 3/02
See application file for complete search history.

(56) References Cited

U.S. PATENT DOCUMENTS 6,166,971 A 12/2000 Tamura et al.
6,317,109 B1 11/2001 Lee
(Continued)

FOREIGN PATENT DOCUMENTS

CN 109565277 A 4/2019
EP 0963083 A 12/1999
(Continued)

OTHER PUBLICATIONS

International Search Report (Application No. PCT/IB2019/055857) dated Oct. 21, 2019.
(Continued)

*Primary Examiner* — Amare Mengistu
*Assistant Examiner* — Jennifer L Zubajlo
(74) *Attorney, Agent, or Firm* — Robinson Intellectual Property Law Office; Eric J. Robinson

(57) ABSTRACT

Variations in a receiving circuit employing differential signaling are reduced. The receiving circuit converts a first signal and a second signal which are supplied through differential signaling into a third signal which is a single-ended signal and outputs the third signal. The receiving circuit includes an operational amplifier, a first element, a first transistor, and a first circuit. The first element is connected to the first circuit through a first node to which the first transistor is connected. The first signal and the second signal that is the inverse of the first signal are supplied to the operational amplifier. The operational amplifier supplies an output signal to the first element, and a first preset potential is supplied to the first node through the first transistor. A signal including variations of the operational amplifier is stored in the first element in accordance with the first preset potential. The first circuit that is supplied with the first preset potential determines an initial value of the third signal
(Continued)

without being influenced by the signal including variations of the operational amplifier.

12 Claims, 20 Drawing Sheets

(51) Int. Cl.
    *H03F 3/45*              (2006.01)
    *H04B 3/02*              (2006.01)

(56) References Cited

U.S. PATENT DOCUMENTS

| | | | |
|---|---|---|---|
| 6,400,616 | B1 | 6/2002 | Tamura et al. |
| 6,707,727 | B2 | 3/2004 | Tamura et al. |
| 6,714,268 | B2 | 3/2004 | Wang et al. |
| 7,038,641 | B2 | 5/2006 | Hirota et al. |
| 7,084,936 | B2 | 8/2006 | Kato |
| 7,102,704 | B2 | 9/2006 | Mitsui et al. |
| 7,167,027 | B2 | 1/2007 | Matsuo et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,315,185 | B2 | 1/2008 | Yu et al. |
| 7,385,654 | B2 | 6/2008 | Mitsui et al. |
| 8,295,424 | B2 | 10/2012 | Choi et al. |
| 9,135,880 | B2 | 9/2015 | Koyama |
| 9,245,650 | B2 | 1/2016 | Inoue et al. |
| 9,391,598 | B2 | 7/2016 | Inoue et al. |
| 10,170,030 | B2 | 1/2019 | Perdices-Gonzalez et al. |
| 10,223,960 | B2 | 3/2019 | Inoue et al. |
| 11,164,494 | B1* | 11/2021 | Hashimoto ............ G09G 3/3233 |
| 2002/0125933 | A1* | 9/2002 | Tamura ................ G11C 7/1069 |
| | | | 327/390 |
| 2003/0052869 | A1 | 3/2003 | Fujii et al. |
| 2003/0201800 | A1 | 10/2003 | Matsuo et al. |
| 2003/0201960 | A1 | 10/2003 | Fujieda |
| 2004/0212578 | A1 | 10/2004 | Itou et al. |
| 2004/0246434 | A1 | 12/2004 | Ohashi et al. |
| 2006/0072047 | A1 | 4/2006 | Sekiguchi |
| 2007/0001956 | A1 | 1/2007 | Yeh et al. |
| 2007/0008005 | A1 | 1/2007 | Komatsu et al. |
| 2007/0018686 | A1 | 1/2007 | Yu et al. |
| 2007/0045620 | A1 | 3/2007 | Park et al. |
| 2007/0055812 | A1 | 3/2007 | Komatsu et al. |
| 2007/0075935 | A1 | 4/2007 | Mesmer et al. |
| 2007/0182690 | A1 | 8/2007 | Lin |
| 2008/0180618 | A1 | 7/2008 | Fujieda |
| 2008/0238442 | A1 | 10/2008 | Ryu |
| 2008/0238819 | A1 | 10/2008 | Ryu |
| 2009/0009505 | A1 | 1/2009 | Koyama |
| 2009/0303224 | A1 | 12/2009 | Yoshida |
| 2010/0103090 | A1 | 4/2010 | Baek |
| 2010/0171905 | A1 | 7/2010 | Huang et al. |
| 2010/0315394 | A1 | 12/2010 | Katoh et al. |
| 2011/0096106 | A1 | 4/2011 | Nomaguchi et al. |
| 2011/0291760 | A1 | 12/2011 | Maruyama |
| 2012/0127140 | A1 | 5/2012 | Ryan et al. |
| 2012/0133688 | A1 | 5/2012 | Shimomaki |
| 2013/0057531 | A1 | 3/2013 | Lim et al. |
| 2013/0141372 | A1 | 6/2013 | Kang |
| 2013/0293451 | A1 | 11/2013 | Yeh et al. |
| 2014/0266379 | A1* | 9/2014 | Inoue .................. H03K 5/2481 |
| | | | 327/307 |
| 2016/0070386 | A1 | 3/2016 | Yamamoto et al. |
| 2016/0210910 | A1 | 7/2016 | Yamazaki et al. |
| 2017/0032755 | A1 | 2/2017 | Ko et al. |
| 2017/0032757 | A1 | 2/2017 | Itoigawa et al. |
| 2017/0032758 | A1* | 2/2017 | Park .................... G09G 3/3688 |
| 2017/0092177 | A1 | 3/2017 | Kobayashi et al. |
| 2017/0103697 | A1 | 4/2017 | Kawashima et al. |
| 2017/0103714 | A1 | 4/2017 | Yamamoto et al. |
| 2017/0179160 | A1 | 6/2017 | Takahashi |
| 2017/0179891 | A1* | 6/2017 | Mora Lopez ............ H03F 1/26 |
| 2017/0357113 | A1 | 12/2017 | Yamazaki et al. |
| 2017/0365203 | A1 | 12/2017 | Takahashi |
| 2018/0012535 | A1 | 1/2018 | Kobayashi |
| 2018/0061307 | A1* | 3/2018 | Inoue ................... H01L 27/3211 |
| 2020/0358410 | A1* | 11/2020 | Makimoto ........... H03F 3/45475 |
| 2021/0058276 | A1* | 2/2021 | Ahmadi ............ H04L 25/03878 |
| 2021/0201757 | A1* | 7/2021 | Kim ....................... H01Q 9/0421 |

FOREIGN PATENT DOCUMENTS

| | | | |
|---|---|---|---|
| EP | 1564948 | A | 8/2005 |
| EP | 1564949 | A | 8/2005 |
| EP | 1564950 | A | 8/2005 |
| JP | H09-214314 | A | 8/1997 |
| JP | 2000-196680 | A | 7/2000 |
| JP | 2001-066593 | A | 3/2001 |
| JP | 2001-077640 | A | 3/2001 |
| JP | 2001077640 | A * | 3/2001 |
| JP | 2002-196702 | A | 7/2002 |
| JP | 2002-328630 | A | 11/2002 |
| JP | 2003-076302 | A | 3/2003 |
| JP | 2003-157026 | A | 5/2003 |
| JP | 2003-157029 | A | 5/2003 |
| JP | 2003-228304 | A | 8/2003 |
| JP | 2003-316295 | A | 11/2003 |
| JP | 2003-318726 | A | 11/2003 |
| JP | 2003-322850 | A | 11/2003 |
| JP | 2004-112424 | A | 4/2004 |
| JP | 2004-296162 | A | 10/2004 |
| JP | 2007-028090 | A | 2/2007 |
| JP | 2007-028600 | A | 2/2007 |
| JP | 2007028090 | A * | 2/2007 |
| JP | 2007-232882 | A | 9/2007 |
| JP | 2008-225381 | A | 9/2008 |
| JP | 4161574 | | 10/2008 |
| JP | 2011-154356 | A | 8/2011 |
| JP | 2012-063753 | A | 3/2012 |
| JP | 2013-221965 | A | 10/2013 |
| JP | 2014-200080 | A | 10/2014 |
| JP | 2015-185940 | A | 10/2015 |
| JP | 2017-116932 | A | 6/2017 |
| JP | 2018-038038 | A | 3/2018 |
| KR | 2000-0005821 | A | 1/2000 |
| KR | 2007-0008245 | A | 1/2007 |
| KR | 2014-0113388 | A | 9/2014 |
| KR | 2019-0039726 | A | 4/2019 |
| WO | WO-2004/053819 | | 6/2004 |
| WO | WO-2007/041150 | | 4/2007 |
| WO | WO-2018/042288 | | 3/2018 |

OTHER PUBLICATIONS

Written Opinion (Application No. PCT/IB2019/055857) dated Oct. 21, 2019.
Shieh.H, "Transflective display by Hybrid OLED and LCD", LEOS 2005 (IEEE Lasers and Electro-Optics Society Annual Meeting), Oct. 22, 2005, pp. 650-651, IEEE.
Lee.J et al., "High ambient-contrast-ratio display using tandem reflective liquid crystal display and organic light-emitting device", Optics Express, Nov. 14, 2005, vol. 13, No. 23, pp. 9431-9438.
Kusunoki.K et al., "Transmissive OLED and Reflective LC Hybrid (TR-Hybrid) Display", SID Digest '16 : SID International Symposium Digest of Technical Papers, May 22, 2016, vol. 47, pp. 57-60.
Sakuishi.T et al., "Transmissive OLED and Reflective LC Hybrid (TR-Hybrid) Display with High Visibility and Low Power Consumption", SID Digest '16 : SID International Symposium Digest of Technical Papers, May 22, 2016, vol. 47, pp. 735-738.
Ohide.T et al., "Application of Transfer Technology to Manufacturing of Transmissive OLED and Reflective LC Hybrid (TR-Hybrid) Display", SID DIGEST'16 : SID International Symposium Digest of Technical Papers, May 22, 2016, vol. 47, pp. 1002-1004.
Boni.A et al., "LVDS I/O Interface for GB/s-per-Pin Operation in 0.35-μm CMOS", IEEE Journal of Solid-State Circuits, Apr. 1, 2001, vol. 36, No. 4, pp. 706-711.
Fei.Z et al., "A LVDS Transceiver Chip Design in 0.5um CMOS Technology", CISP '08 (Congress on Image and Signal Processing 2008), May 27, 2008, pp. 124-127.

(56) References Cited

OTHER PUBLICATIONS

International Search Report (Application No. PCT/IB2017/055070) dated Nov. 28, 2017.
Written Opinion (Application No. PCT/IB2017/055070) dated Nov. 28, 2017.

* cited by examiner

124A

124B

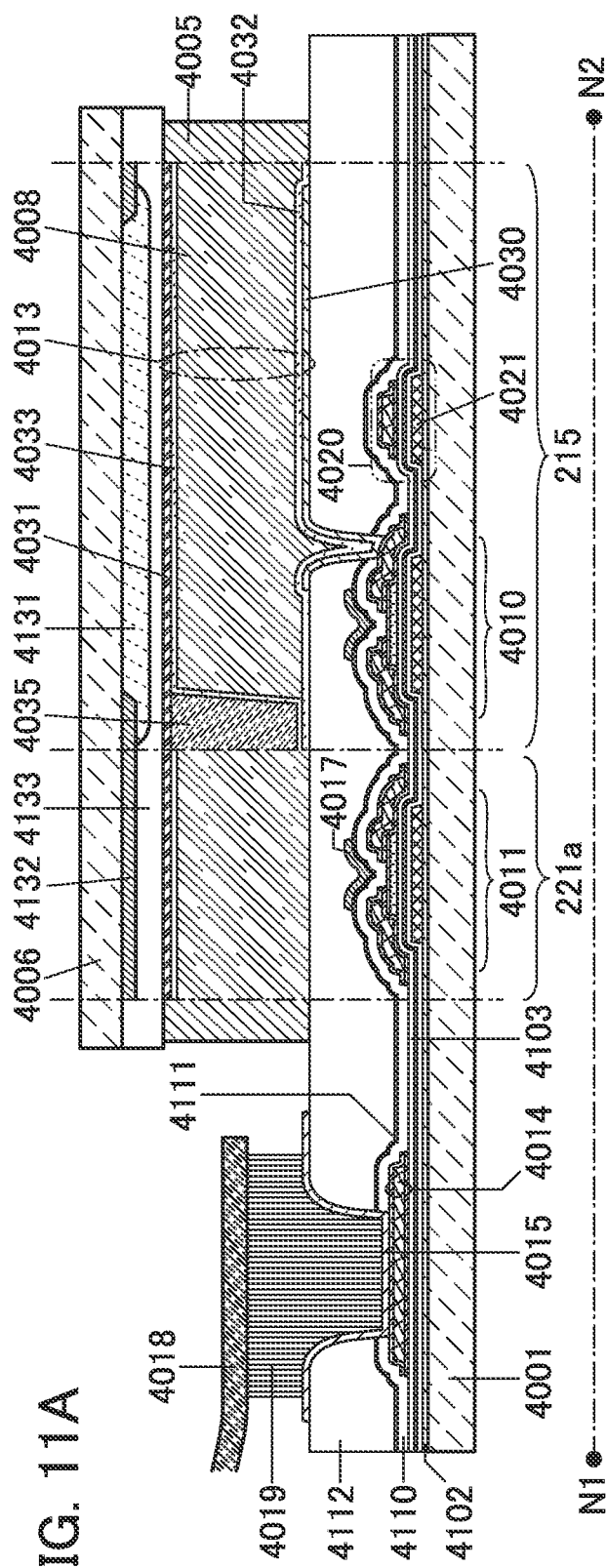
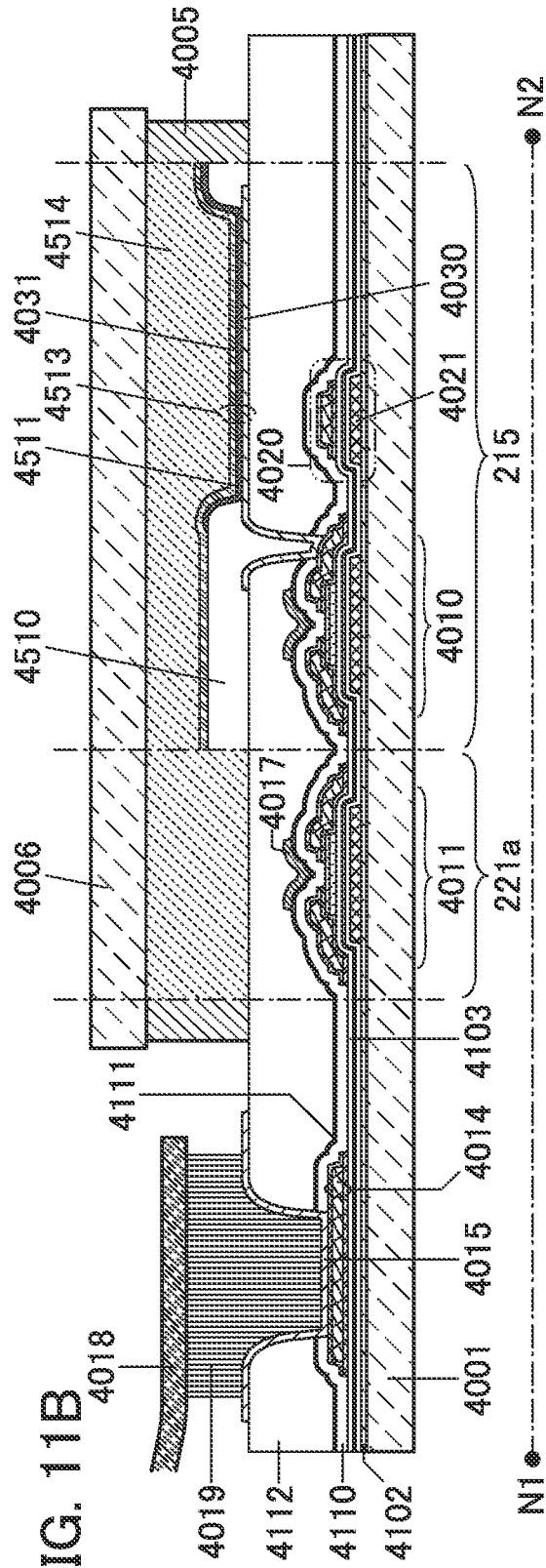
FIG. 11A
FIG. 11B

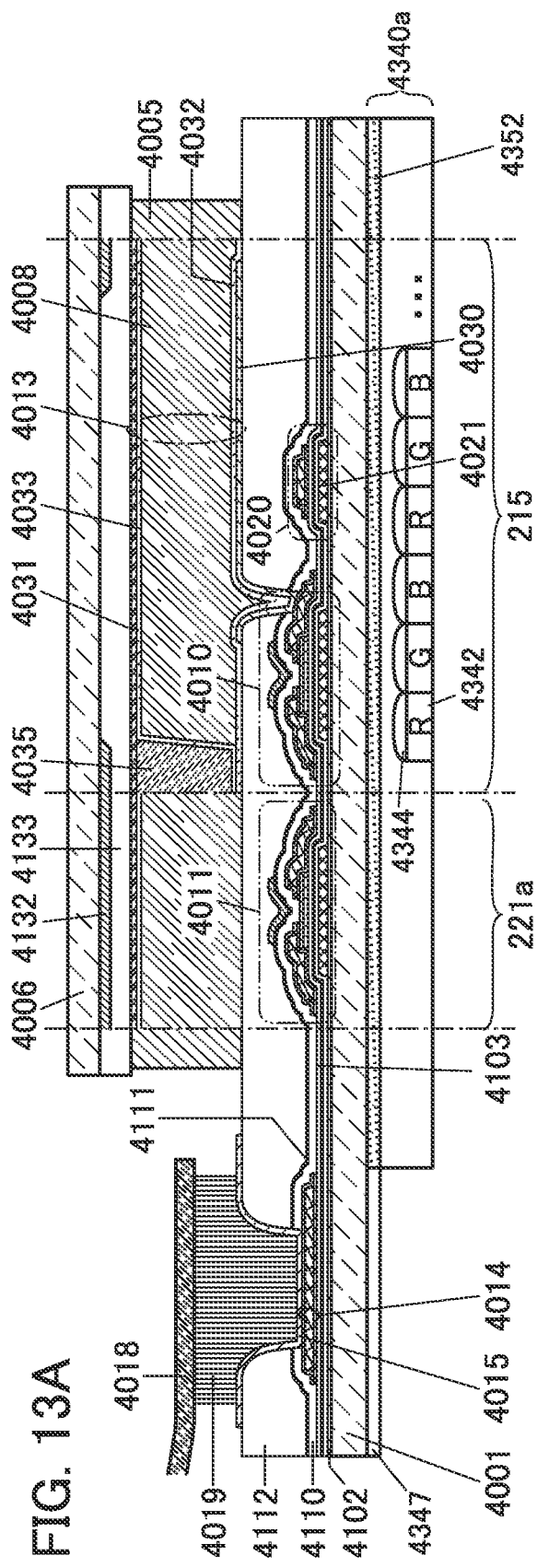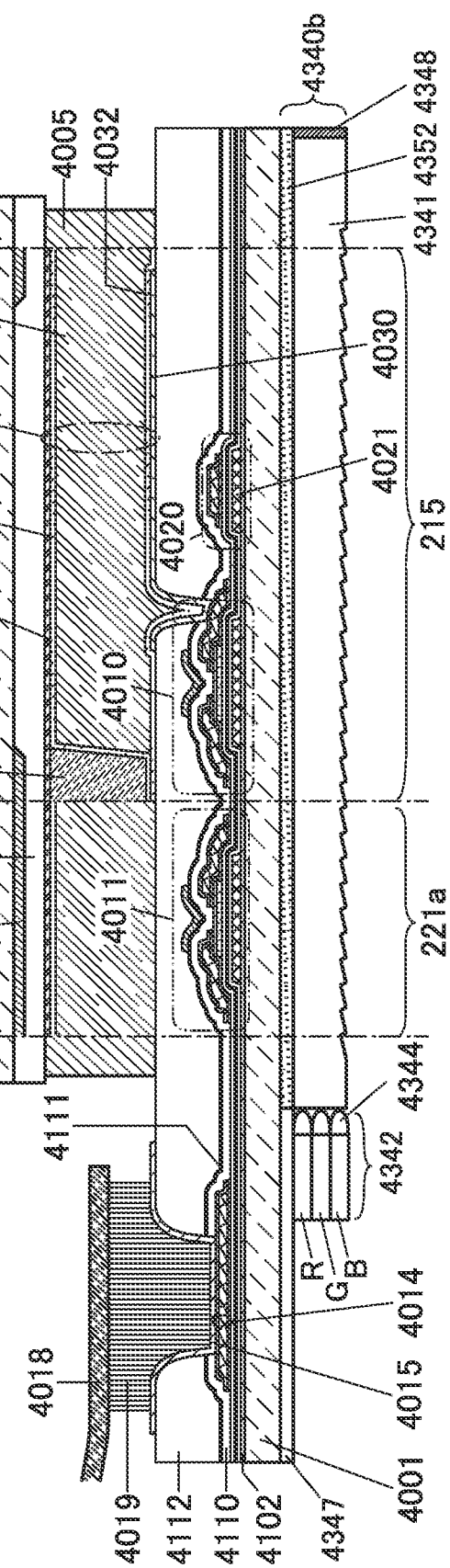

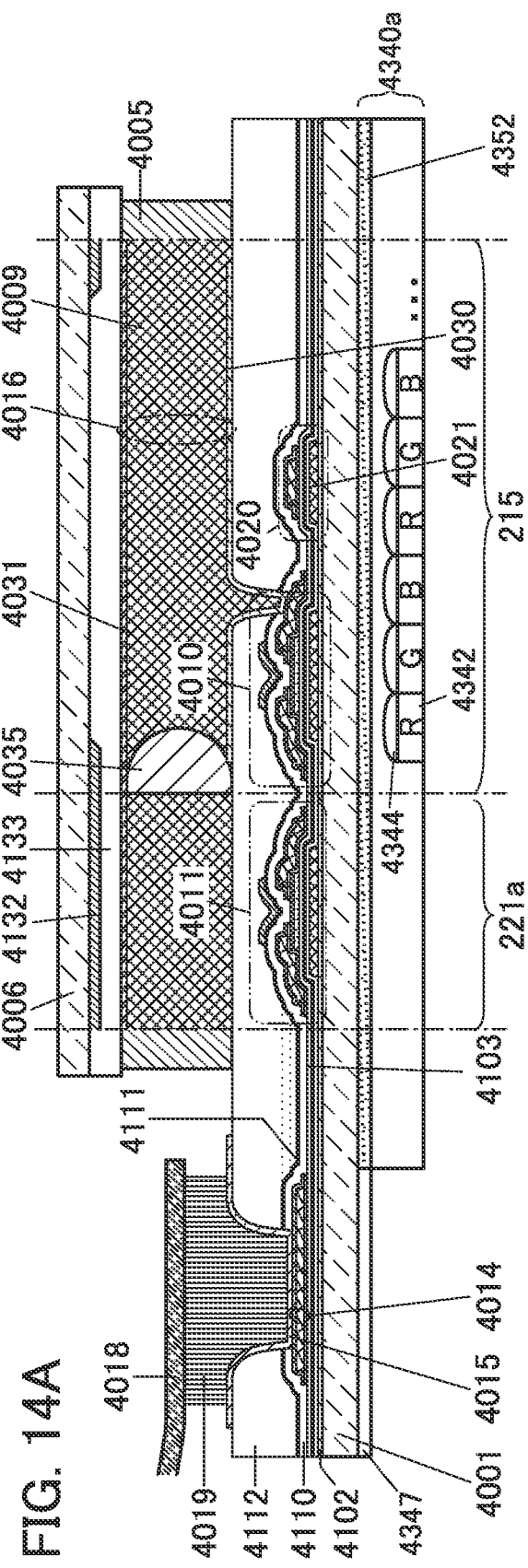
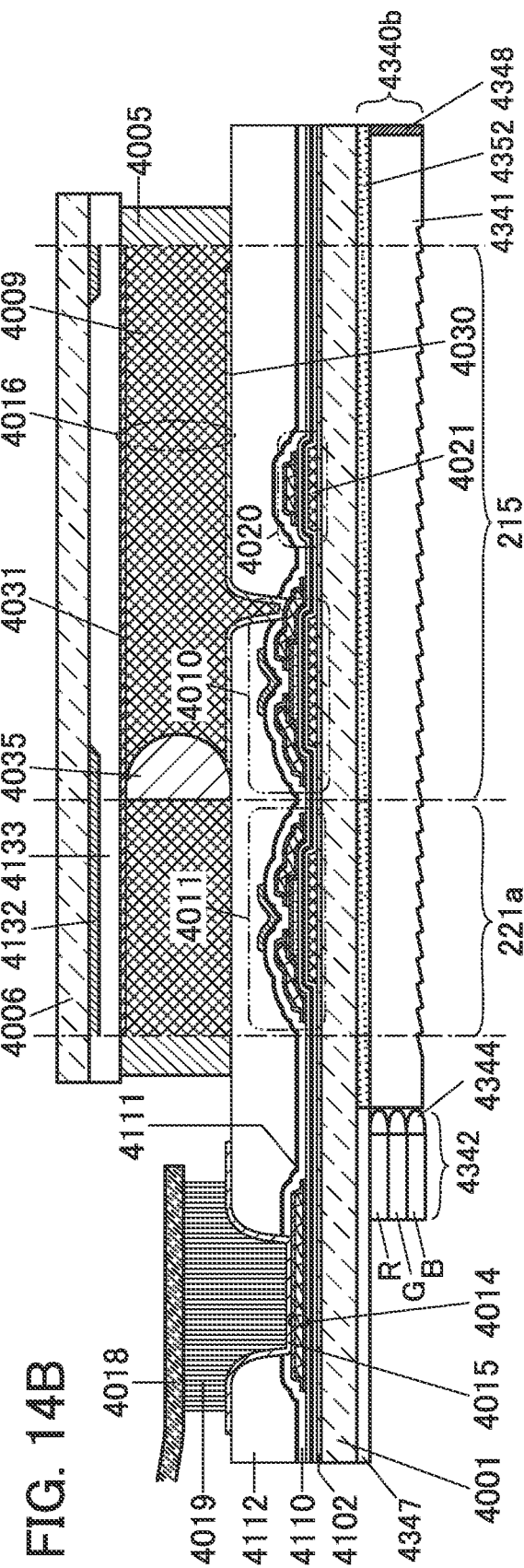
FIG. 14A
FIG. 14B

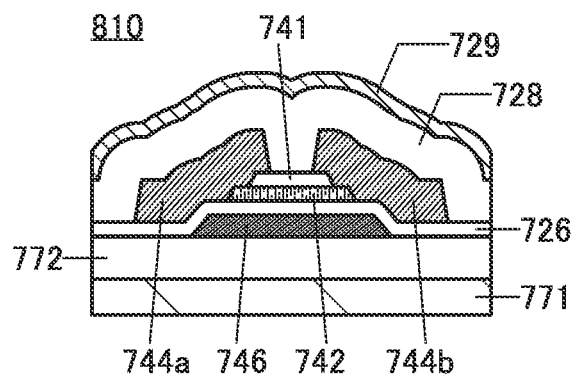
FIG. 16A1
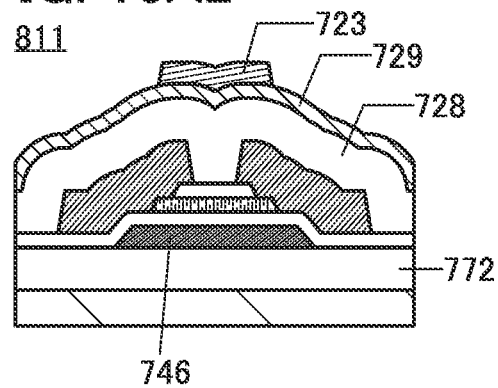
FIG. 16A2
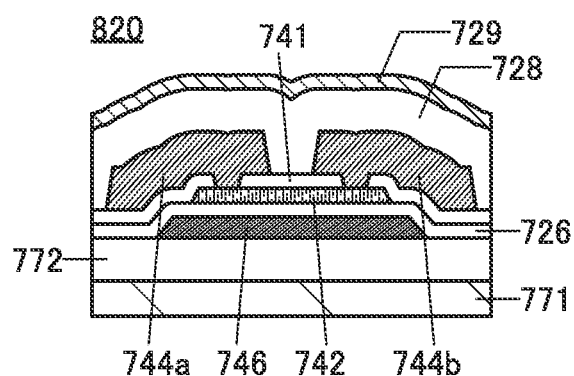
FIG. 16B1
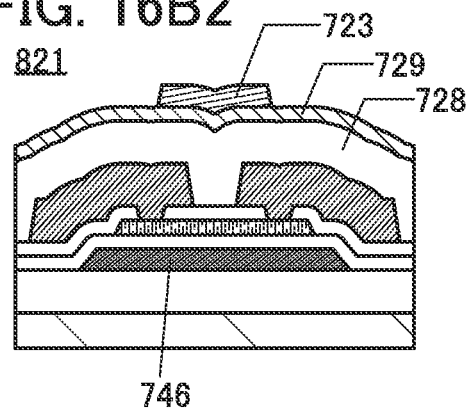
FIG. 16B2
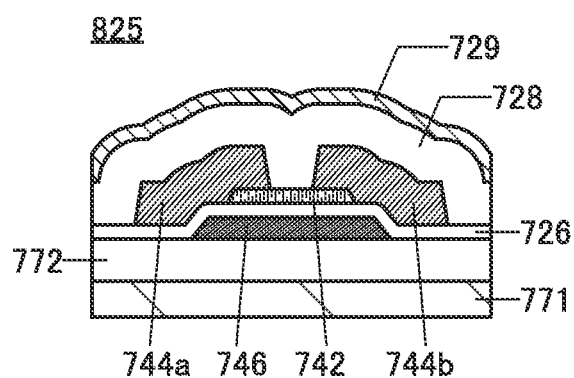
FIG. 16C1
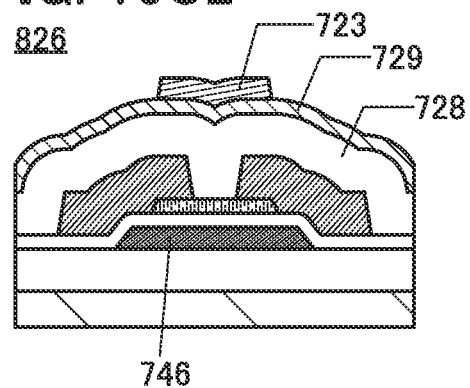
FIG. 16C2

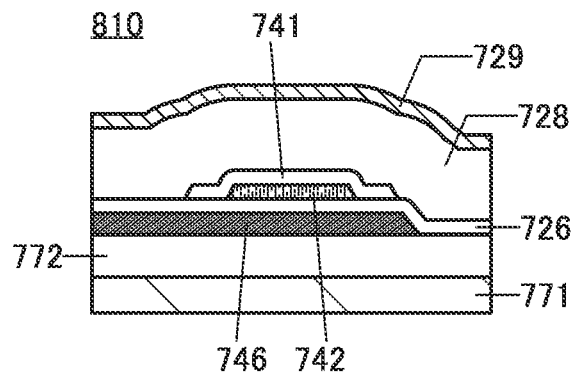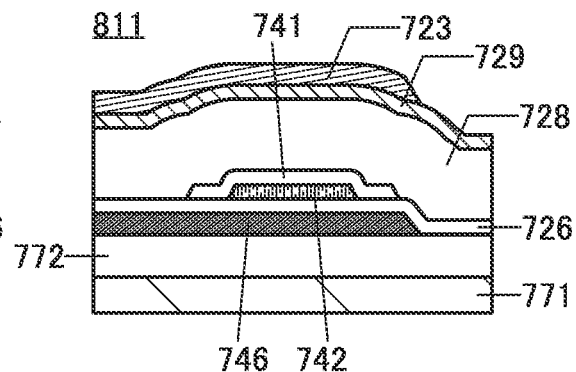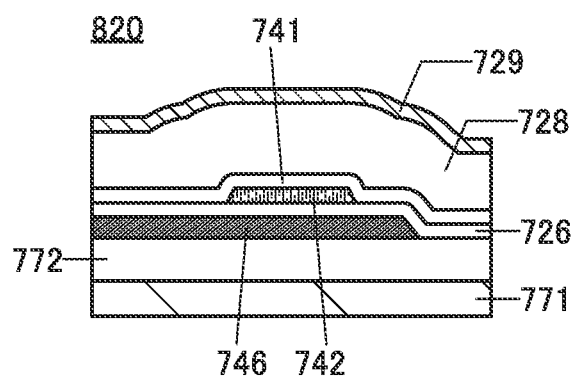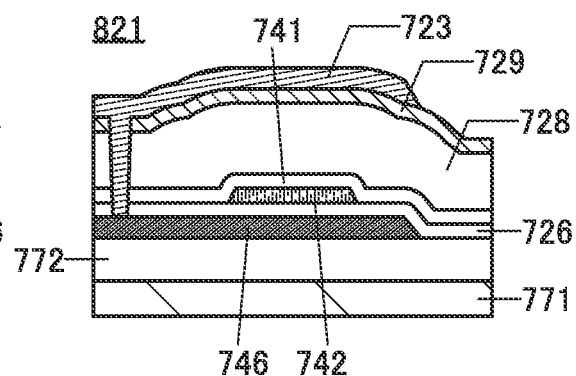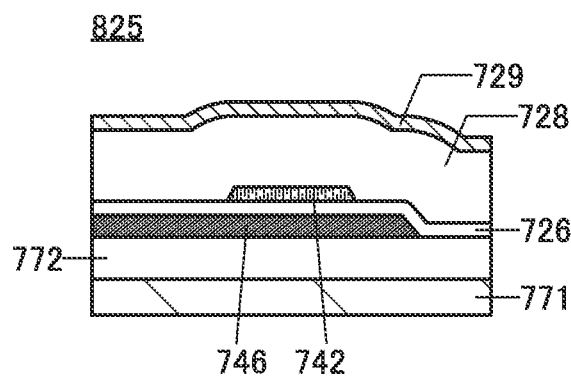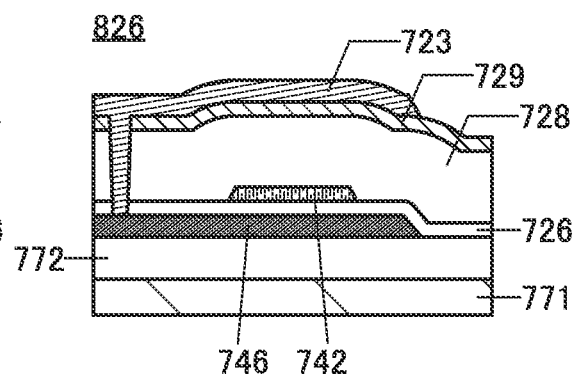

FIG. 18A1
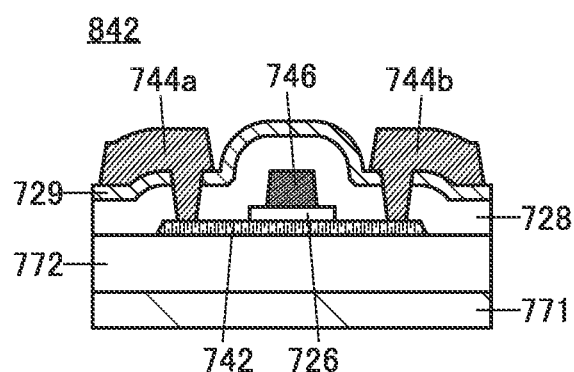
FIG. 18A2
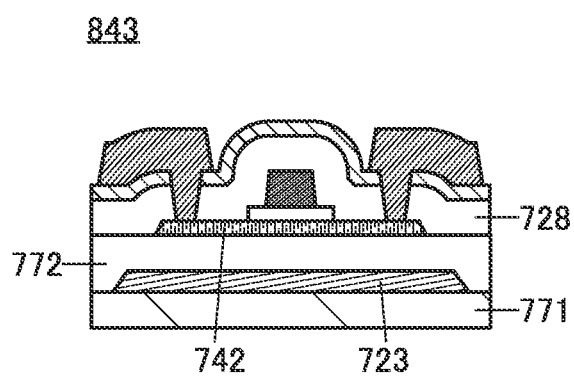
FIG. 18B1
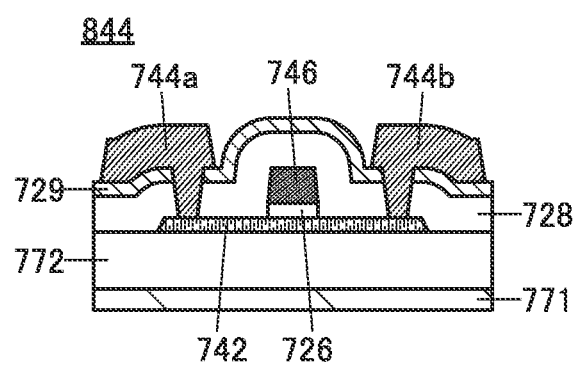
FIG. 18B2
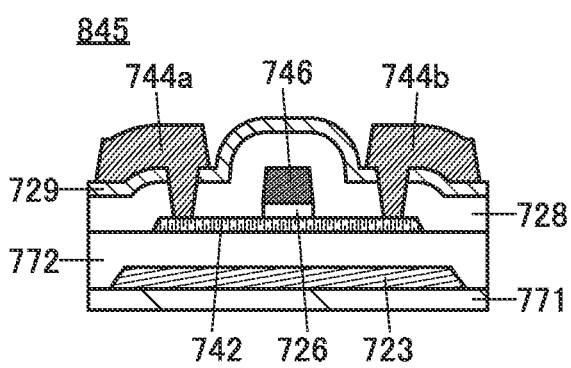
FIG. 18C1
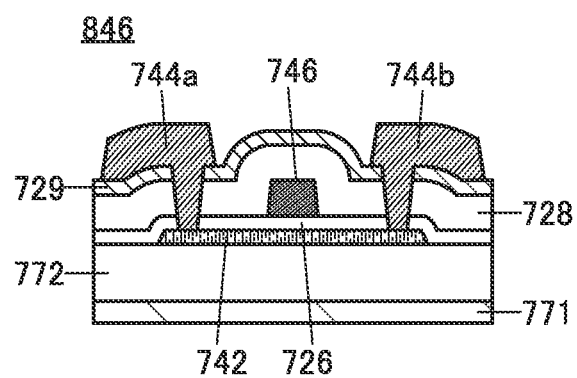
FIG. 18C2
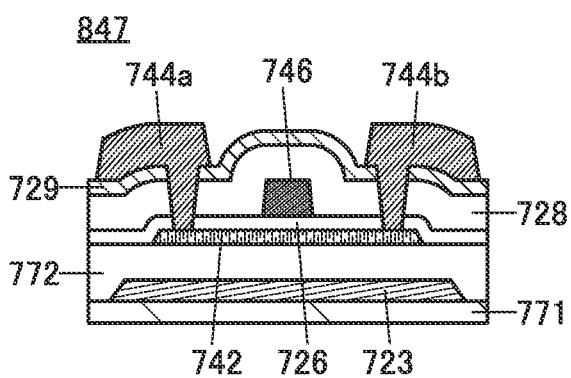

FIG. 19A1
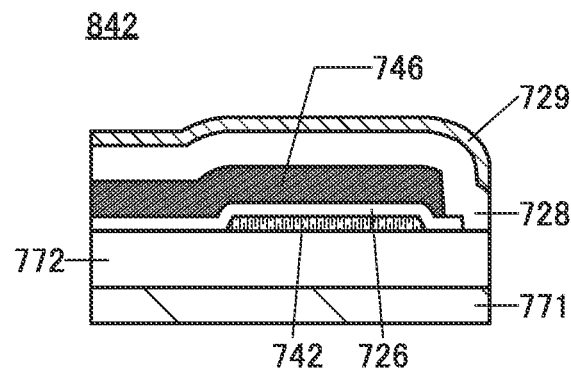
FIG. 19A2
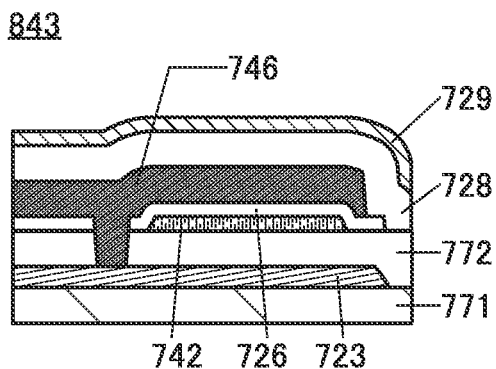
FIG. 19B1
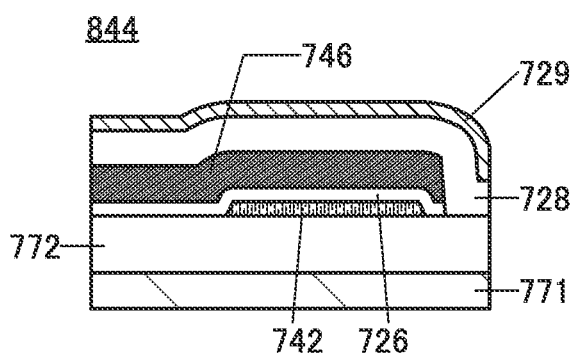
FIG. 19B2
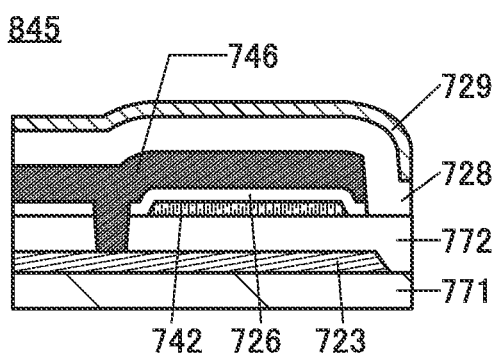
FIG. 19C1
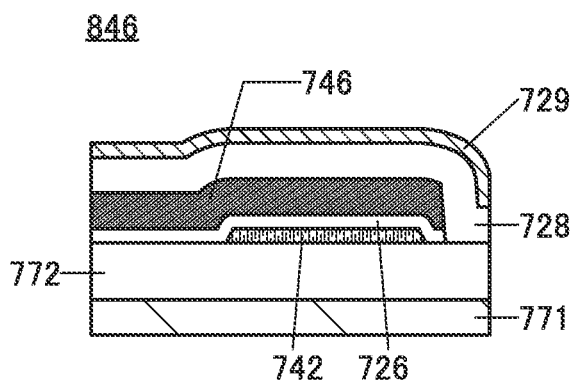
FIG. 19C2
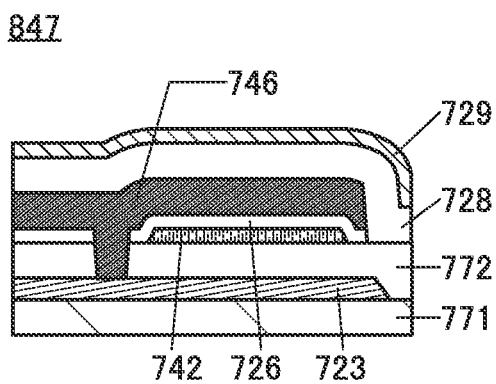

RECEIVING CIRCUIT

TECHNICAL FIELD

One embodiment of the present invention relates to a receiving circuit, a display device, or an electronic device.

Note that one embodiment of the present invention is not limited to the above technical field. The technical field of one embodiment of the invention disclosed in this specification and the like relates to an object, a method, or a manufacturing method. Alternatively, the present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

In this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

In recent years, the definition of a display device has been increased. The increase in definition of a display device is likely to increase the number of wirings for transmitting an image signal to the display device and power consumption, for example. In the case where an image signal is transmitted at high speed, electromagnetic interference (EMI) might occur and influence other peripheral circuits or other electronic devices by noise. In addition, a display device is required to have electromagnetic susceptibility (EMS) which prevents an influence of signals in the display device or an influence of noise generated by surrounding other electronic devices and achieves correct transmission.

As a means of transmitting a signal to a display device, differential signaling in which two signal lines are used and a signal "H" or a signal "L" is expressed in accordance with which signal potential is higher has become the mainstream as the definition of the display device increases. Low-voltage differential signaling (LVDS) defined by the TIA/EIA644 standard (telecommunications industry association (TIA), electronic industries alliance (EIA)) is often employed as one of differential signaling. LVDS is a communication technology capable of reducing power consumption and an influence of noise, by including a differential circuit operated by differential signaling and using a low voltage differential signal.

For example, Patent Document 1 discloses a driver circuit used in an LVDS.

REFERENCE

Patent Document

[Patent Document 1] Japanese Published Patent Application No. H09-214314

SUMMARY OF THE INVENTION

Problems to be Solved by the Invention

Higher definition of a display device increases the number of pixels, and such an increase in the number of pixels increases the amount of transmitted image signals. Accordingly, transmitting image signals at high speed is needed. LVDS can remove noise using a differential input signal with an operational amplifier, can inhibit degradation of transmitted image signals, and thus can suppress a reduction in display quality.

However, there has been a problem in that an image signal is not received correctly because of the differential amplitude of a differential input signal influenced by variations in transistors included in a receiver circuit of LVDS. There has also been a problem in that in the operational amplifier to which a differential input signal is supplied, a transmitted image signal is degraded and converted into a wrong image signal when the differential amplitude of the differential input signal becomes lower than or equal to a certain potential difference.

In view of the above problems, an object of one embodiment of the present invention is to provide a receiving circuit with a novel structure. Another object of one embodiment of the present invention is to inhibit degradation of transmitted signals by suppressing variations in electrical characteristics of the receiving circuit. Another object of one embodiment of the present invention is to provide a display device with a novel structure. Another object of one embodiment of the present invention is to inhibit degradation of transmitted image signals by suppressing variations in electrical characteristics of the display device.

Note that the description of these objects does not preclude the existence of other objects. One embodiment of the present invention does not have to achieve all these objects. Other objects are apparent from and can be derived from the description of the specification, the drawings, the claims, and the like.

Note that the objects of one embodiment of the present invention are not limited to the objects listed above. The objects listed above do not preclude the existence of other objects. The other objects are objects that are not described in this section and will be described below. The objects that are not described in this section will be derived from the description of the specification, the drawings, and the like and can be extracted from the description by those skilled in the art. Note that one embodiment of the present invention is to solve at least one of the objects listed above and/or the other objects.

Means for Solving the Problems

One embodiment of the present invention is a receiving circuit converting a first signal and a second signal which are supplied through differential signaling into a third signal which is a single-ended signal. The receiving circuit includes an operational amplifier, a first element, a first transistor, and a first circuit. The operational amplifier includes a first input terminal, a second input terminal, and a first output terminal. The operational amplifier is electrically connected to the first element. The first element is electrically connected to the first circuit through a first node. One of a source and a drain of the first transistor is electrically connected to the first node. The first signal is supplied to the first input terminal. The second signal that is the inverse of the first signal is supplied to the second input terminal. The operational amplifier supplies a signal output from the first output terminal to the first element. A first preset potential is supplied to the first node through the first transistor. A signal including variations of the operational amplifier is stored in the first element in accordance with the first preset potential. The first circuit supplied with the first preset potential determines an initial value of the third signal without being influenced by the signal including variations of the operational amplifier.

The receiving circuit with the above structure preferably further includes a second element and a second transistor. The second element is electrically connected to the first input terminal of the operational amplifier through a second node. One of a source and a drain of the second transistor is electrically connected to the second node. The first signal is supplied to the second element. A first program potential is supplied to the second node through the second transistor. Variations included in the first signal are stored in the second element in accordance with the first program potential. The operational amplifier supplied with the first program potential outputs a signal including variations of the operational amplifier to the first output terminal without being influenced by variations included in the first signal.

The receiving circuit with the above structure preferably further includes a third element and a third transistor. The operational amplifier further includes a second output terminal. The third element is electrically connected to the second input terminal of the operational amplifier through a third node. One of a source and a drain of the third transistor is electrically connected to the third node. The second signal is supplied to the third element. A second program potential is supplied to the third node through the third transistor. Variations included in the second signal are stored in the third element in accordance with the second program potential. The operational amplifier supplied with the second program potential outputs a signal including variations of the operational amplifier to the second output terminal without being influenced by variations included in the second signal.

In the above structure, the first element to the third element are preferably capacitors.

In the above structure, the operational amplifier includes a fourth transistor. The first transistor and the fourth transistor preferably contain the same material in the respective semiconductor layers.

In the above structure, the semiconductor layer of the first transistor preferably includes metal oxide.

Effect of the Invention

One embodiment of the present invention can provide a receiving circuit with a novel structure. One embodiment of the present invention can inhibit degradation of transmitted signals by suppressing variations in electrical characteristics of the receiving circuit. One embodiment of the present invention can provide a display device with a novel structure. One embodiment of the present invention can inhibit degradation of transmitted image signals by suppressing variations in electrical characteristics of the display device.

Note that the effects of one embodiment of the present invention are not limited to the effects listed above. The effects listed above do not preclude the existence of other effects. The other effects are effects that are not described in this section and will be described below. The effects that are not described in this section will be derived from the description of the specification, the drawings, and the like and can be extracted from the description by those skilled in the art. Note that one embodiment of the present invention has at least one of the effects listed above and/or the other effects. Therefore, one embodiment of the present invention does not have the effects listed above in some cases.

BRIEF DESCRIPTION OF THE DRAWINGS

FIG. 11 (A) (B) Diagrams each illustrating a display device.

FIG. 13 (A) (B) Diagrams each illustrating a display device.

FIG. 14 (A) (B) Diagrams each illustrating a display device.

FIG. 16 (A1) (A2) (B1) (B2) (C1) (C2) Diagrams each illustrating a transistor.

FIG. 17 (A1) (A2) (B1) (B2) (C1) (C2) Diagrams each illustrating a transistor.

FIG. 18 (A1) (A2) (B1) (B2) (C1) (C2) Diagrams each illustrating a transistor.

FIG. 19 (A1) (A2) (B1) (B2) (C1) (C2) Diagrams each illustrating a transistor.

MODE FOR CARRYING OUT THE INVENTION

Figure 1:
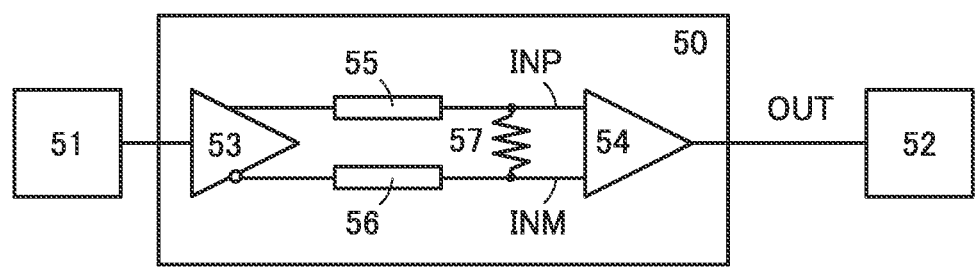
FIG. 1 A diagram illustrating a transmitting/receiving circuit.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Thus, they are not limited to the illustrated scale. Note that the drawings are schematic views illustrating ideal examples, and embodiments of the present invention are not limited to shapes or values shown in the drawings.

Furthermore, it is noted that ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. The positional relation between components is changed as appropriate in accordance with a direction in which each component is described. Thus, without limitation to terms described in this specification, the description can be changed appropriately depending on the situation.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and can make current flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeably used in this specification and the like.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. Moreover, "perpendicular" indicates a state where two straight lines are placed at an angle of greater than or equal to 80° and less than or equal to 100°. Thus, the case where the angle is greater than or equal to 85° and less than or equal to 95° is also included.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

Unless otherwise specified, off-state current in this specification and the like refers to a drain current of a transistor in an off state (also referred to as a non-conducting state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes refers to a drain current at the time when the voltage Vgs between its gate and source is lower than the threshold voltage Vth.

The off-state current of a transistor depends on Vgs in some cases. Thus, the off-state current of a transistor is lower than or equal to I sometimes means that there is Vgs with which the off-state current of the transistor becomes lower than or equal to I. The off-state current of a transistor sometimes refers to the off-state current in an off state at predetermined Vgs, in an off state at Vgs in a predetermined range, in an off state at Vgs with which sufficiently reduced off-state current is obtained, or the like.

As an example, the assumption is made of an n-channel transistor where the threshold voltage Vth is 0.5 V, and the drain current at Vgs of 0.5 V is $1 \times 10^{-9}$ A, the drain current at Vgs of 0.1 V is $1 \times 10^{-13}$ A, the drain current at Vgs of −0.5 V is $1 \times 10^{-19}$ A, and the drain current at Vgs of −0.8 V is $1 \times 10^{-22}$ A. The drain current of the transistor is lower than or equal to $1 \times 10^{-19}$ A at Vgs of −0.5 V or at Vgs in the range of −0.5 V to −0.8 V; therefore, it is sometimes said that the off-state current of the transistor is lower than or equal to $1 \times 10^{-19}$ A. Since there is Vgs at which the drain current of the transistor is lower than or equal to $1 \times 10^{-22}$ A, it is sometimes said that the off-state current of the transistor is lower than or equal to $1 \times 10^{-22}$ A.

In this specification and the like, the off-state current of a transistor having a channel width W is sometimes represented by the value of flowing current per channel width W. Alternatively, it is sometimes represented by the value of flowing current per given channel width (e.g., 1 μm). In the latter case, the off-state current is sometimes represented by the unit with the dimension of current per length (e.g., A/μm).

The off-state current of a transistor depends on temperature in some cases. Unless otherwise specified, the off-state current in this specification sometimes refers to off-state current at room temperature, 60° C., 85° C., 95° C., or 125° C. Alternatively, the off-state current sometimes refers to off-state current at a temperature at which reliability of a semiconductor device or the like including the transistor is ensured or a temperature at which a semiconductor device or the like including the transistor is used (e.g., any temperature in the range of 5° C. to 35° C.). The off-state current of the transistor being lower than or equal to I sometimes means that there is Vgs at which the off-state current of a transistor is lower than or equal to I at room temperature, 60° C., 85° C., 95° C., 125° C., a temperature at which reliability of a semiconductor device or the like including the transistor is ensured, or a temperature at which the semiconductor device or the like including the transistor is used (e.g., any temperature in the range of 5° C. to 35° C.).

The off-state current of a transistor depends on the voltage Vds between its drain and source in some cases. Unless otherwise specified, the off-state current in this specification sometimes refers to an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current sometimes refers to off-state current at Vds at which reliability of a semiconductor device or the like including the transistor is ensured or Vds used in the semiconductor device or the like including the transistor. The off-state current of the transistor being lower than or equal to I sometimes means that there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device or the like including the transistor is ensured, or at Vds used in the semiconductor device or the like including the transistor.

In the above description of the off-state current, the drain may be replaced with the source. That is, the off-state current sometimes refers to a current that flows through a source of a transistor in an off state.

In this specification and the like, leakage current sometimes expresses the same meaning as off-state current. Furthermore, in this specification and the like, the off-state current sometimes refers to current that flows between a source and a drain of a transistor in an off state, for example.

Note that a voltage refers to a potential difference between two points, and a potential refers to electrostatic energy (electric potential energy) of a unit charge at a given point in an electrostatic field. Note that in general, a potential difference between a potential at a given point and a reference potential (e.g., a ground potential) is simply called potential or voltage, and potential and voltage are used as synonymous words in many cases. Therefore, in this specification, a potential may be rephrased as a voltage and a voltage may be rephrased as a potential unless otherwise specified.

Embodiment 1

In this embodiment, a receiving circuit that converts a first signal supplied through differential signaling into a second signal which is a single-ended signal will be described with reference to FIG. 1 to FIG. 8.

In one embodiment of the present invention, an offset component of the receiving circuit to which a data signal is input through differential signaling can be reduced. Here, described as an example is a receiving circuit that receives a data signal transmitted through LVDS that is standardized on the basis of the TIA/EIA-644 standard. Note that the method of transmitting a data signal through differential signaling is not limited to LVDS. The receiving circuit can be applied to other differential signaling standards, such as ECL (Emitter Coupled Logic), PECL (Positive Emitter Coupled Logic), LVPECL (Low-Voltage Positive Emitter Coupled Logic), RS-422 (TIA/EIA-422 standard), and RS-485 (TIA/EIA-485 standard).

A display device is one of electronic devices to which a data signal is preferably transmitted through differential signaling. The data signal can be rephrased as an image signal supplied to a pixel. Higher definition of the display device increases the number of pixels, and such an increase in the number of pixels increases the data amount of image signals needed for display. Thus, transmitting image signals at high speed is required.

Through differential signaling (description is made using LVDS as an example of differential signaling), an image signal is transmitted with use of a differential signal, whereby noise components which overlap with the image signal, such as EMI or EMS, can be reduced. Accordingly, through LVDS, degradation of a transmitted image signal can be inhibited, whereby a decrease in display quality can be prevented. Note that LVDS can suppress an influence by EMI or EMC and reduce power consumption by including a differential circuit and using a low voltage differential signal.

Here, an electronic device including a receiving circuit of one embodiment of the present invention is described. For example, the electronic device preferably includes a control unit and a display device. As an example, the display device includes a display controller and a display panel. The display controller includes a transmitting circuit (a transmitter) that transmits the first signal, which is a differential signaling image signal, to the display device. The display device includes a receiving circuit (a receiver), a driver circuit, and a display portion. The display portion includes a plurality of pixels.

The transmitting circuit is connected to the receiving circuit through a first transmission path and a second transmission path. The first transmission path is electrically connected to a first input terminal of the receiving circuit, and the second transmission path is electrically connected to a second input terminal of the receiving circuit. The first transmission path is supplied with the first signal, and the second transmission path is supplied with the second signal. The second signal is an inverted signal of the first signal. Specifically, in the case where the first transmission path is supplied with the signal "H", the second transmission path is supplied with the signal "L". Alternatively, in the case where the first transmission path is supplied with the signal "L", the second transmission path is supplied with the signal "H".

That is, the transmitting circuit transmits the first signal and the second signal through differential signaling, and the receiving circuit includes the first input terminal for receiving the first signal and the second input terminal for receiving the second signal. The receiving circuit can convert the first signal and the second signal, which are differential image signals, into a third signal, which is a single-ended image signal. The third signal is supplied to a pixel, and the pixel performs display using the third signal.

The receiving circuit includes a resistor, a first circuit, a second circuit, the first input terminal, the second input terminal, and a first output terminal. The first circuit includes an operational amplifier, a first transistor, a second transistor, a first element, and a second element. The second circuit includes a third transistor, a fourth transistor, a third element, a fourth element, and a third circuit. The operational amplifier includes a third input terminal, a fourth input terminal, a second output terminal, and a third output terminal. The third circuit includes a fifth input terminal, a sixth input terminal, and a fourth output terminal.

The third input terminal is electrically connected to one electrode of the first element and one of a source and a drain of the first transistor through a first node. The fourth input terminal is electrically connected to one electrode of the second element and one of a source and a drain of the second transistor through a second node. The second output terminal is electrically connected to one electrode of the third element. The third output terminal is electrically connected to one electrode of the fourth element. The fifth input terminal is electrically connected to the other electrode of the third element and one of a source and a drain of the third transistor through a third node. The sixth input terminal is electrically connected to the other electrode of the fourth element and one of a source and a drain of the fourth transistor through a fourth node.

The first transmission path is electrically connected to the first element through the first input terminal, and the second transmission path is electrically connected to the second element through the second input terminal. The first transmission path is electrically connected to the second transmission path through the resistor. Note that the resistor is preferably disposed in the vicinity of the receiving circuit. That is, the resistor has a function of terminating the transmission path. The length of a node connecting the first element and the resistor is preferably as short as possible, and the length of a node connecting the second element and the resistor is preferably as short as possible. The length of the node connecting the first element and the resistor is preferably equal to the length of the node connecting the second element and the resistor. When the length of the node connecting the first element and the resistor is equal to the length of the node connecting the second element and the resistor, the transmission paths can have the same impedance. The differential signals that operate complementarily make the impedance of the first transmission path and the impedance of the second transmission path the same, whereby unnecessary reflection of the signals can be reduced.

However, the signal "H" supplied to the first input terminal or the signal "L" supplied to the second input terminal sometimes includes an offset component of a transmitting circuit, a transmission path, or the like. Therefore, the offset component of the transmission path or the like is preferably reduced. For example, as a method of reducing the offset component of the transmission path or the like, the first node is preferably set to be insulated from the first transmission path. More specifically, the first transmission path can make the first node to be in an insulating state by using the first element. As the first element, a capacitor is preferably used, for example. As another example of the first element, a transistor having a low off-state current may be used. For example, it is known that a transistor including an oxide semiconductor in a semiconductor layer where a channel formation region is formed has a low off-state current.

Next, the first circuit is described. The first node is supplied with a first program potential through the first transistor. The second node is supplied with a second program potential through the second transistor. The first program potential is a potential for storing an offset component of the first signal supplied to the first element. The second program potential is a potential for storing an offset component of the second signal supplied to the second element.

Note that in a period when the first program potential or the second program potential is supplied, the display device preferably stops transmitting and receiving of an image signal. For example, in a period when receiving of an image signal is stopped, the signal "H", which is a fixed potential, is supplied to the first input terminal, and the signal "L", which is a fixed potential, is supplied to the second input terminal. Alternatively, the signal "L", which is a fixed potential, may be supplied to the first input terminal, and the signal "H", which is a fixed potential, may be supplied to the second input terminal.

As each of the first transistor and the second transistor, a transistor with a low off-state current is preferably used. In the case of using a transistor with a low off-state current, the first node or the second node is brought into a floating state when the transistor is turned off. Thus, a change in the first program potential supplied to the first node or the second program potential supplied to the second node can be inhibited. That is, the frequency of refreshing the first program potential or the second program potential can be reduced.

The first program potential is supplied to the third input terminal through the first transistor. In the first element, variations included in the first signal are stored in accordance with the first program potential. The second program potential is supplied to the fourth input terminal through the second transistor. In the second element, variations included in the second signal are stored in accordance with the second program potential.

Thus, the operational amplifier included in the first circuit is not influenced by variations included in the first signal by being supplied with the first program potential, and can output a fourth signal including variations of the operational amplifier to the second output terminal. The operational amplifier included in the first circuit is not influenced by variations included in the second signal by being supplied with the second program potential, and can output a fifth signal including variations of the operational amplifier to the third output terminal. Note that the variations of the operational amplifier may be rephrased as variations in transistors included in the operational amplifier.

In this embodiment, the same potential as the second program potential is preferably supplied as the first program potential. The same potential is supplied to the first node and the second node, whereby variations of the operational amplifier are output to the second output terminal or the third output terminal. Note that in the case where the operational amplifier outputs a single-ended output signal, the fourth signal may be output to the second output terminal.

Note that as the first program potential, a potential different from the second program potential may be supplied. For example, when different potentials are supplied as the first program potential and the second program potential, the first element stores an influence of the offset component included in the first signal and the second element stores an influence of the offset component included in the second signal, whereby output of the operational amplifier may be determined by the first program potential or the second program potential.

Next, the second circuit is described. A first preset potential is supplied to the third node at which the third element and the fifth input terminal of the third circuit are connected, through the third transistor. In the third element, variations included in an output signal from the operational amplifier are stored in accordance with the first preset potential. A second preset potential is supplied to the fourth node at which the fourth element and the sixth input terminal of the third circuit are connected, through the fourth transistor. In the fourth element, variations included in an output signal from the operational amplifier are stored in accordance with the second preset potential. Therefore, an influence of the offset component included in the third signal can be reduced.

Note that in a period when the first preset potential or the second preset potential is supplied, the display device preferably stops transmitting and receiving of an image signal. For example, in a period when receiving of an image signal is stopped, it is preferable that the signal "H", which is a fixed potential, be supplied to the first input terminal, and the signal "L", which is a fixed potential, be supplied to the second input terminal.

As each of the third transistor and the fourth transistor, a transistor with a low off-state current is preferably used. In the case of using a transistor with a low off-state current, the third node or the fourth node is brought into a floating state when the transistor is turned off. Thus, a change in the first preset potential supplied to the third node or the second preset potential supplied to the fourth node can be inhibited. That is, the frequency of refreshing the first preset potential or the second preset potential can be reduced.

Next, the third circuit is described. The third circuit can convert the fourth signal and the fifth signal, which are differential signals generated by the first circuit, into the third signal, which is a single-ended signal, and output the third signal from the second output terminal. That is, when the third node is supplied with the first preset potential and the fourth node is supplied with the second preset potential, the initial value of the third signal is determined by the first preset potential or the second preset potential.

In other words, in the third circuit, the offset components included in the fourth signal and the fifth signal are reduced by the third element and the fourth element. Accordingly, the third circuit is not influenced by the offset components included in the fourth signal and the fifth signal. Note that the initial value of the fourth output terminal of the third circuit is preferably the signal "H" or the signal "L".

In this embodiment, the initial value of the third signal is determined by the first program potential and the second program potential, which are supplied to the first circuit, and the first preset potential and the second preset potential, which are supplied to the second circuit. The receiving circuit, which is initialized by the first program potential, the second program potential, the first preset potential, and the second preset potential, converts the first signal and the second signal, which are received through differential signaling, into the third signal. Therefore, the receiving circuit described in this embodiment can reduce variations due to the transmission path or variations in output of the operational amplifier included in the receiving circuit.

Next, a transmitting/receiving circuit that converts the first signal supplied through differential signaling into the second signal which is a single-ended signal is described in detail with reference to the block diagram in FIG. 1. Note that FIG. 1 illustrates the case where a control unit 51 transmits a data signal to a control unit 52 through a transmitting/receiving circuit 50. Note that the control unit 52 may be a passive device, such as a display panel, a memory device, or a data server.

The transmitting/receiving circuit 50 includes a transmitting circuit 53, a receiving circuit 54, a transmission path 55, a transmission path 56, and a resistor 57. Note that the resistor 57 may be included in the receiving circuit 54. The control unit 51 is electrically connected to the transmitting circuit 53. The transmitting circuit 53 is electrically connected to the receiving circuit 54 through the transmission path 55 and the transmission path 56. The receiving circuit 54 is electrically connected to the control unit 52. The transmission path 55 is electrically connected to the transmission path 56 through the resistor 57.

The transmitting circuit 53 can transmit the first signal to the receiving circuit 54 through differential signaling. The receiving circuit 54 can convert the first signal into the second signal which is a single-ended signal and supply the second signal to the control unit 52.

Figure 2A:
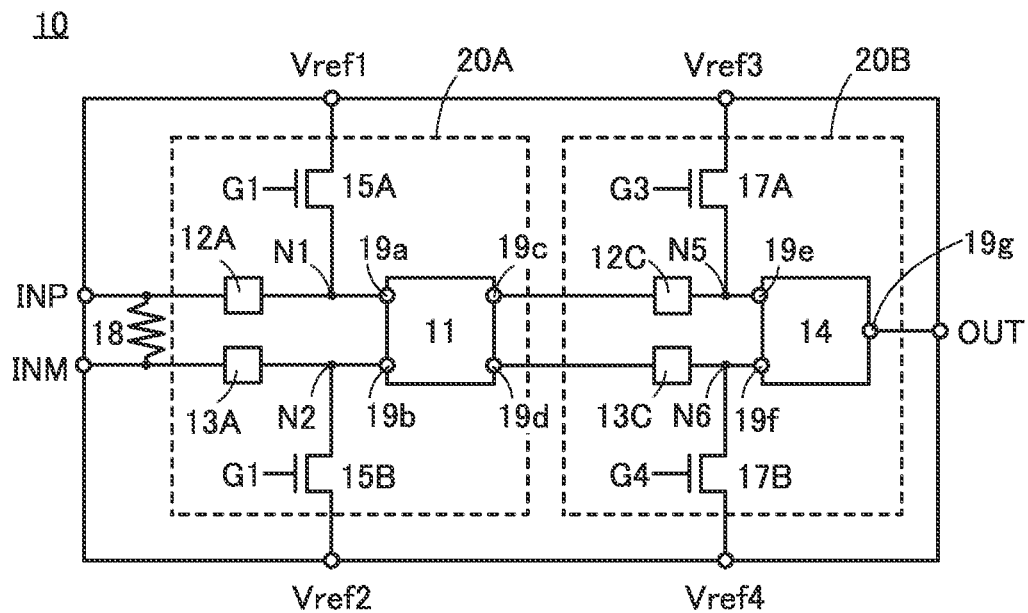
FIG. 2 (A) (B) Diagrams each illustrating a transmitting/receiving circuit.

A receiving circuit 10 is described in detail with reference to the circuit diagram in FIG. 2(A). The receiving circuit 10 corresponds to the receiving circuit 54 in FIG. 1. The receiving circuit 10 includes a resistor 18, a circuit 20A, a circuit 20B, an input terminal INP, an input terminal INM, and an output terminal OUT. The circuit 20A includes an operational amplifier 11, a transistor 15A, a transistor 15B, an element 12A, and an element 13A. The circuit 20B includes a transistor 17A, a transistor 17B, an element 12C, an element 13C, and a circuit 14. The operational amplifier 11 includes an input terminal 19a, an input terminal 19b, an output terminal 19c, and an output terminal 19d. The circuit 14 includes an input terminal 19e, an input terminal 19f, and an output terminal 19g.

The input terminal 19a is electrically connected to one electrode of the element 12A and one of a source and a drain of the transistor 15A through a node N1. The input terminal 19b is electrically connected to one electrode of the element 13A and one of a source and a drain of the transistor 15B through a node N2. The output terminal 19c is electrically connected to one electrode of the element 12C. The output terminal 19d is electrically connected to one electrode of the element 13C. The input terminal 19e is electrically connected to the other electrode of the element 12C and one of a source and a drain of the transistor 17A through a node N5. The input terminal 19f is electrically connected to the other electrode of the element 13C and one of a source and a drain of the transistor 17B through a node N6. The signal line G1 is electrically connected to each of a gate of the transistor 15A and a gate of the transistor 15B. A signal line G3 is electrically connected to a gate of the transistor 17A. A signal line G4 is electrically connected to a gate of the transistor 17B.

The transmission path 55 is electrically connected to the element 12A through the input terminal INP, and the transmission path 56 is electrically connected to the element 13A through the input terminal INM. The transmission path 55 is electrically connected to the transmission path 56 through the resistor 18. Note that the resistor 18 is preferably disposed in the vicinity of the operational amplifier 11.

The signal "H" supplied to the input terminal INP or the signal "L" supplied to the input terminal INM sometimes includes an offset component of the transmitting circuit 53, the transmission path 55, the transmission path 56 (the transmission path 55 and the transmission path 56 are collectively described as a transmission path in some cases), or the like. Therefore, the offset component of the transmission path or the like is preferably reduced. For example, as a method of reducing the offset component of the transmission path or the like, the node N1 is preferably set to be insulated from the transmission path 55. More specifically, the transmission path 55 can make the node N1 to be in an insulating state by using the element 12A. As the element 12A, a capacitor can be used, for example. As another example of the element 12A, a transistor having a low off-state current may be used. For example, it is known that a transistor including an oxide semiconductor in a semiconductor layer where a channel formation region is formed has a low off-state current.

Next, the circuit 20A is described. A program potential Vref1 is supplied to the node N1 through the transistor 15A. A program potential Vref2 is supplied to the node N2 through the transistor 15B. The program potential Vref1 is a potential that includes the offset component of the first signal supplied to the element 12A. The program potential Vref2 is a potential that includes the offset component of the second signal supplied to the element 13A.

Note that in a period when the program potential Vref1 or the program potential Vref2 is supplied, the display device preferably stops transmitting and receiving of the first signal. For example, in a period when receiving of the first signal is stopped, the signal "H", which is a fixed potential, is supplied to the input terminal INP, and the signal "L", which is a fixed potential, is supplied to the input terminal INM. Alternatively, the signal "L", which is a fixed potential, may be supplied to the input terminal INP, and the signal "H", which is a fixed potential, may be supplied to the input terminal INM.

As each of the transistor 15A and the transistor 15B, a transistor with a low off-state current is preferably used. In the case of using a transistor with a low off-state current, the node N1 or the node N2 is brought into a floating state when the transistor 15A and the transistor 15B are turned off. Thus, a change in the program potential Vref1 supplied to the node N1 or the program potential Vref2 supplied to the node N2 can be inhibited. That is, the frequency of refreshing the program potential Vref1 or the program potential Vref2 can be reduced.

The program potential Vref1 is supplied to the input terminal 19a through the transistor 15A. In the element 12A, variations included in the first signal are stored in accordance with the program potential Vref1. The program potential Vref2 is supplied to the input terminal 19b through the transistor 15B. In the element 13A, variations included in the second signal are stored in accordance with the program potential Vref2.

Thus, the operational amplifier 11 is not influenced by variations included in the first signal by being supplied with the program potential Vref1, and can output a fourth signal including variations of the operational amplifier to the output terminal 19c. The operational amplifier 11 is not influenced by variations included in the second signal by being supplied with the program potential Vref2, and can output the fifth signal including variations of the operational amplifier to the output terminal 19d.

In this embodiment, the same potential as the program potential Vref2 is preferably supplied as the program potential Vref1. The same potential is supplied to the node N1 and the node N2, whereby variations of the operational amplifier 11 are output to the output terminal 19c or the output terminal 19d. Note that in the case where the operational amplifier 11 outputs a single-ended output signal, the fourth signal may be output to the output terminal 19d.

Note that as the program potential Vref1, a potential different from the program potential Vref2 may be supplied. For example, when different potentials are supplied as the program potential Vref1 and the program potential Vref2, the element 12A stores an influence of the offset component included in the first signal and the element 13A stores an influence of the offset component included in the second signal. In this manner, the output of the operational amplifier 11 may be determined by the program potential Vref1 or the program potential Vref2.

Next, the circuit 20B is described. A preset potential Vref3 is supplied to the node N5 at which the element 12C and the input terminal 19e of the circuit 14 are connected, through the transistor 17A. In the element 12C, variations included in an output signal from the operational amplifier 11 are stored in accordance with the preset potential Vref3. A preset potential Vref4 is supplied to the node N6 at which the element 13C and the input terminal 19f of the circuit 14 are connected, through the transistor 17B. In the element 13C, variations included in an output signal from the operational amplifier 11 are stored in accordance with the preset potential Vref4. Therefore, an influence of the offset component included in the third signal can be reduced.

Note that in a period when the preset potential Vref3 or the preset potential Vref4 is supplied, the display device preferably stops transmitting and receiving of the first signal. For example, in a period when receiving of the first signal is stopped, the signal "H", which is a fixed potential, is supplied to the input terminal INP, and the signal "L", which is a fixed potential, is supplied to the input terminal INM.

As each of the transistor 17A and the transistor 17B, a transistor with a low off-state current is preferably used. In the case of using a transistor with a low off-state current, the node N5 or the node N6 is brought into a floating state when the transistor 17A and the transistor 17B are turned off. Thus, a change in the preset potential Vref3 supplied to the node N5 or the preset potential Vref4 supplied to the node N6 can be inhibited. That is, the frequency of refreshing the preset potential Vref3 or the preset potential Vref4 can be reduced.

Next, the circuit 14 is described. The circuit 14 can convert the fourth signal and the fifth signal, which are differential signals generated by the circuit 20A, into the third signal, which is a single-ended signal, and output the third signal to the output terminal OUT. That is, when the node N5 is supplied with the preset potential Vref3 and the node N6 is supplied with the preset potential Vref4, the initial value of the third signal is determined by the preset potential Vref3 or the preset potential Vref4.

In other words, in the circuit 20B, the offset components included in the fourth signal and the fifth signal are reduced by the element 12C and the element 13C. Accordingly, the circuit 20B is not influenced by the offset components included in the fourth signal and the fifth signal. Note that the initial value of the output terminal 19g of the circuit 20B is preferably the signal "H" or the signal "L".

In this embodiment, the initial value of the third signal is determined by the program potential Vref1 and the program potential Vref2, which are supplied to the circuit 20A, and the preset potential Vref3 and the preset potential Vref4, which are supplied to the circuit 20B. The receiving circuit 10, which is initialized by the program potential Vref1, the program potential Vref2, the preset potential Vref3, and the preset potential Vref4, converts the first signal and the second signal, which are received through differential signaling, into the third signal. Therefore, the receiving circuit 10 described in this embodiment can reduce variations due to the transmission path or variations in output of the operational amplifier 11.

Figure 2B:
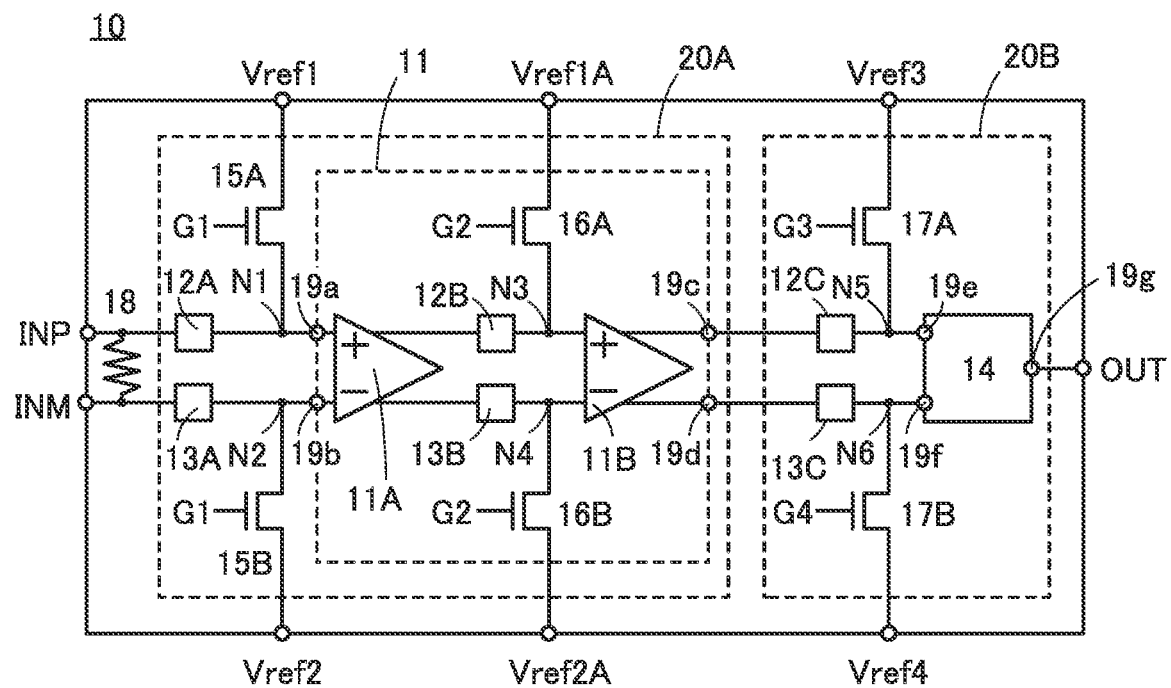

Next, the details of the operational amplifier 11 included in the receiving circuit 10 are described with reference to the circuit diagram in FIG. 2(B). The operational amplifier 11 includes an operational amplifier 11A, an operational amplifier 11B, an element 12B, an element 13B, a transistor 16A, and a transistor 16B.

The input terminal 19a is electrically connected to an input terminal IP1 (not illustrated) of the operational amplifier 11A. The input terminal 19b is electrically connected to an input terminal IM1 (not illustrated) of the operational amplifier 11A. An output terminal OP1 (not illustrated) of the operational amplifier 11A is electrically connected to the element 12B. An output terminal OM1 (not illustrated) of the operational amplifier 11A is electrically connected to the element 13B. The element 12B is electrically connected to an input terminal IP2 (not illustrated) of the operational amplifier 11B and one of a source and a drain of the transistor 16A through the node N3. The element 13B is electrically connected to an input terminal IM2 (not illustrated) of the operational amplifier 11B and one of a source and a drain of the transistor 16B through the node N4. An output terminal OP2 (not illustrated) of the operational amplifier 11B is electrically connected to the output terminal 19c. An output terminal OM2 (not illustrated) of the operational amplifier 11A is electrically connected to the output terminal 19d. A signal line G2 is electrically connected to gates of the transistor 16A and the transistor 16B.

A program potential Vref1A is supplied to the node N3 through the transistor 16A. A program potential Vref2A is supplied to the node N4 through the transistor 16B. Note that the description of the element 12C, the element 13C, the transistor 17A, and the transistor 17B can be referred to for functions of the element 12B, the element 13B, the transistor 16A, and the transistor 16B.

The operational amplifier 11A preferably increases the amplitude of the first signal or the second signal. In other words, the operational amplifier 11A functions as a comparator. The operational amplifier 11B preferably has frequency characteristics capable of driving without degrading a frequency component of the first signal or the second signal whose amplitude is increased by the operational amplifier 11A.

Note that the operational amplifier 11A or the operational amplifier 11B includes an offset component due to variations in transistors included in the corresponding operational amplifier in some cases. Accordingly, the offset component of the operational amplifier 11A or the operational amplifier 11B is preferably canceled. Note that as the program potential Vref1A and the program potential Vref2A, the same potential as the program potential Vref1 is preferably supplied. When the same potential as the program potential Vref1 is supplied as the program potential Vref1A and the program potential Vref2A, the offset component due to variations of the operational amplifier 11B is supplied to the element 12C and the element 13C. Note that the operational amplifier 11A and the operational amplifier 11B may be one operational amplifier.

Details of the element 12A to the element 12C and the element 13A to the element 13C are described with reference to the circuit diagram of the receiving circuit 10 illustrated in FIG. 3(A). In an example illustrated in FIG. 3(A), the element 12A to the element 12C and the element 13A to the element 13C are capacitors. The use of the capacitors enables the node N1 to the node N6 be brought into a floating state easily. Note that as the element 12A to the element 12C and the element 13A to the element 13C, transistors with a low off-state current may be used. An example of using transistors with a low off-state current is described in detail in FIG. 5(A).

Next, the circuit 14 included in the receiving circuit 10 is described in detail with reference to the circuit diagram in FIG. 3(B). The circuit 14 includes the input terminal 19e, the input terminal 19f, the output terminal 19g, a circuit 14A, a circuit 14B, and a circuit 14C. The circuit 14A includes a transistor 21A and a transistor 21B. The circuit 14B includes a transistor 22A, a transistor 22B, a transistor 23A, a transistor 23B, and a capacitor 23C. The circuit 14C includes a transistor 24A, a transistor 24B, a transistor 24C, and a capacitor 24D. The input terminal 19e is electrically connected to a gate of the transistor 21A. The input terminal 19f is electrically connected to a gate of the transistor 21B.

One of a source and a drain of the transistor 21A is electrically connected to one of a source and a drain of the transistor 21B, a gate of the transistor 22B, and a gate of the transistor 23B. The other of the source and the drain of the transistor 21A is electrically connected to a power supply line V1. The other of the source and the drain of the transistor 21B is electrically connected to a power supply line V6.

One of a source and a drain of the transistor 22A is electrically connected to one of a source and a drain of the transistor 22B, a gate of the transistor 23A, and one electrode of the capacitor 23C. A gate of the transistor 22A is electrically connected to the other of the source and the drain of the transistor 22A and a power supply line V2. The other electrode of the capacitor 23C is electrically connected to one of a source and a drain of the transistor 23A, one of a source and a drain of the transistor 23B, and a gate of the transistor 24B. The other of the source and the drain of the transistor 23A is electrically connected to a power supply line V3. The other of the source and the drain of the transistor 22B is electrically connected to the power supply line V6. The other of the source and the drain of the transistor 23B is electrically connected to the power supply line V6.

One of a source and a drain of the transistor 24B is electrically connected to one of a source and a drain of the transistor 24A, one electrode of the capacitor 24D, and the output terminal 19g. A gate of the transistor 24A is electrically connected to the other electrode of the capacitor 24D and one of a source and a drain of the transistor 24C. The other of the source and the drain of the transistor 24A is electrically connected to a power supply line V5. The other of the source and the drain of the transistor 24C is electrically connected to a gate of the transistor 24C and a power supply line V4. The other of the source and the drain of the transistor 24B is electrically connected to the power supply line V6.

A signal from which the offset component included in the fourth signal or the fifth signal is removed is supplied to the circuit 14. Note that the fourth signal or the fifth signal supplied to the circuit 14 is a differential signal. The circuit 14A functions as a switch circuit for converting the fourth signal or the fifth signal which is a differential signal to a sixth signal which is a single-ended signal. It is preferable that the potential width of a potential supplied to the power supply line V1 be wider than the potential width of an output potential of the operational amplifier 11. The potential supplied to the power supply line V6 is preferably a reference potential of the circuit 14. For example, the potential supplied to the power supply line V6 can be a ground potential.

The circuit 14B functions as a level shifter circuit. A potential supplied to the power supply line V2 is preferably the highest potential among the potentials supplied to the circuit 14. Accordingly, the amplitude of the sixth signal can be increased. The transistor 22A is a diode-connected transistor, and the current supply capability of the transistor 22A determines the switching speed of the transistor 23A. A potential supplied to the power supply line V3 is preferably equal to a potential supplied to the power supply line V5 to be described later. Note that a potential supplied to the gate of the transistor 23A is increased by bootstrapping using the capacitor 23C. Accordingly, the current supply capability of the transistor 23A is increased.

The circuit 14C functions as a buffer circuit. The power supply line V5 determines the amount of a potential in the case where the circuit 14C outputs the signal "H" to the output terminal 19g. The transistor 24C is a diode-connected transistor, and the current supply capability of the transistor 24C determines the switching speed of the transistor 24A. Note that a potential supplied to the gate of the transistor 24A is increased by bootstrapping using the capacitor 24D. Accordingly, the current supply capability of the transistor 24A is increased. Note that it is preferable that the potential supplied to the power supply line V4 be higher than the potential supplied to the power supply line V5. Alternatively, the potential supplied to the power supply line V4 may be equal to the potential supplied to the power supply line V3 and the power supply line V5. When the same potential is employed, the number of kinds of power supplies used can be reduced. As to the potentials supplied to the power supply line connected to the circuit 14, it is preferable that the potential supplied to the power supply line V1 be the lowest and the potential supplied to the power supply line V5 be the highest.

Figure 4:
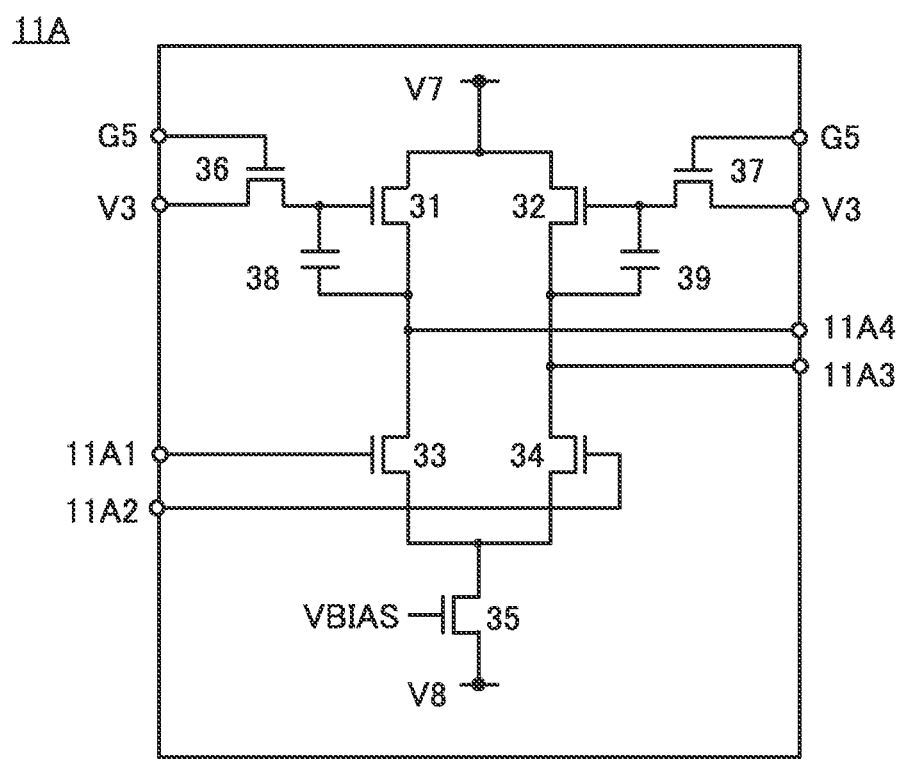
FIG. 4 A diagram illustrating a receiving circuit.

The operational amplifier 11A is described in detail as an example, with reference to the circuit diagram in FIG. 4. The operational amplifier 11A includes an input terminal 11A1, an input terminal 11A2, an output terminal 11A3, and an output terminal 11A4.

The operational amplifier 11A includes a transistor 31 to a transistor 37, a capacitor 38, and a capacitor 39. One of a source and a drain of the transistor 31 is electrically connected to a power supply line V7 and one of a source and a drain of the transistor 32. The other of the source and the drain of the transistor 31 is electrically connected to one of a source and a drain of the transistor 33, one electrode of the capacitor 38, and the output terminal 11A4. The other of the source and the drain of the transistor 32 is electrically connected to one of a source and a drain of the transistor 34, one electrode of the capacitor 39, and the output terminal 11A3.

The other of the source and the drain of the transistor 33 is electrically connected to one of the source and the drain of the transistor 35 and the other of the source and the drain of the transistor 34. The other of the source and the drain of the transistor 35 is electrically connected to a power supply line V8. A gate of the transistor 33 is electrically connected to the input terminal 11A1. A gate of the transistor 34 is electrically connected to the input terminal 11A2.

One of a source and a drain of the transistor 36 is electrically connected to a gate of the transistor 31 and the other electrode of the capacitor 38. The other of the source and the drain of the transistor 36 is electrically connected to the power supply line V3. One of a source and a drain of the transistor 37 is electrically connected to a gate of the transistor 32 and the other electrode of the capacitor 39. The other of the source and the drain of the transistor 37 is electrically connected to the power supply line V3. A gate of the transistor 35 is electrically connected to a power supply line VBIAS. A gate of the transistor 36 and a gate of the transistor 37 are electrically connected to the signal line G5.

The transistor 36 is turned on by a signal supplied to the signal line G5, and the potential of the power supply line V3 is supplied to the gate of the transistor 31 through the transistor 36. The transistor 37 is turned on by the signal supplied to the signal line G5, and the potential of the power supply line V3 is supplied to the gate of the transistor 32 through the transistor 37. The gate of the transistor 31 and the gate of the transistor 32 are brought into a floating state when the transistor 36 and the transistor 37 are turned off by the signal supplied to the signal line G5. Note that the potential supplied to the power supply line V8 is preferably lower than the potential supplied to the power supply line V6 in FIG. 3(B).

The capacitor 38 and the capacitor 39 have a function of bootstrapping and increase potentials supplied to the gates of the transistor 31 and the transistor 32, and thus have an effect of increasing the current supply capability of the transistor 31 or the transistor 32. Thus, the transistor 31 and the transistor 32 function as current sources of signals output to the output terminal 11A3 and the output terminal 11A4, respectively.

The receiving circuit 10A is described in detail with reference to the circuit diagram in FIG. 5(A). The receiving circuit 10A is different from FIG. 3(A) in that the receiving circuit 10A includes a transistor 19A, a transistor 19B, an operational amplifier 11B1, and a circuit 14D. Here, portions different from those of the receiving circuit 10 described with FIG. 3(A) are described.

Figure 5A:
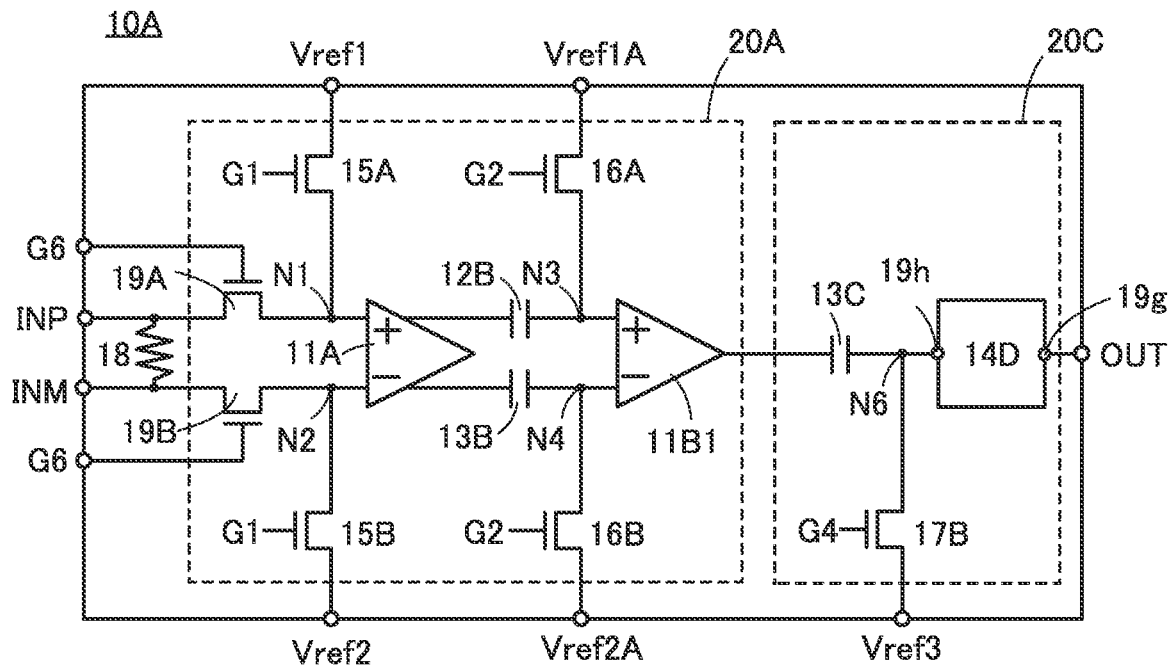
FIG. 5 (A) (B) Diagrams each illustrating a receiving circuit.

In FIG. 5(A), the node N1 or the node N2 can be brought into a floating state with use of the transistor 19A and the transistor 19B. In this case, transistors with a low off-state current are preferably used as the transistors. Transistors each including an oxide semiconductor in the semiconductor layer where a channel formation region is formed can be used as the transistors. Note that the on/off states of gates of the transistor 19A and the transistor 19B are preferably controlled by a signal supplied to a signal line G6.

Next, the operational amplifier 11B1 is described. The operational amplifier 11B1 is different in that it outputs a single-ended signal. The single-ended signaling has an effect in which the transistor 17A, the element 12C, a wiring, and the like can be reduced, as compared with output through differential signaling.

Figure 5B:
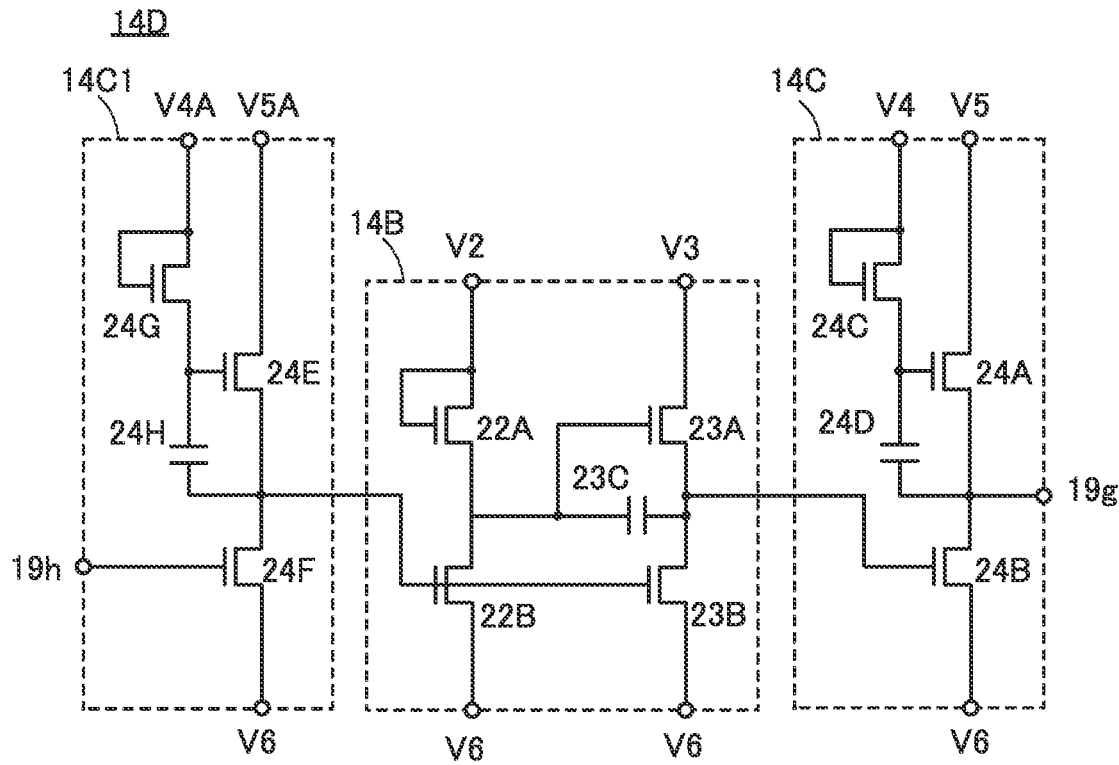

Next, the circuit 14D is described in detail with reference to the circuit diagram in FIG. 5(B). The circuit 14D is different from FIG. 3(B) in that the circuit 14D includes a circuit 14C1. The circuit 14C1 includes an input terminal 19h, a transistor 24E, a transistor 24F, a transistor 24G, and a capacitor 24H.

The input terminal 19h is electrically connected to a gate of the transistor 24F. One of a source and a drain of the transistor 24F is electrically connected to one of a source and a drain of the transistor 24E, one electrode of the capacitor 24H, the gate of the transistor 22B, and the gate of the transistor 23B. A gate of the transistor 24E is electrically connected to one of a source and a drain of the transistor 24G and the other electrode of the capacitor 24H. The other of the source and the drain of the transistor 24E is electrically connected to a power supply line V5A. The other of the source and the drain of the transistor 24G is electrically connected to a power supply line V4A. The other of the source and the drain of the transistor 24F is electrically connected to the power supply line V6.

Like the circuit 14C, the circuit 14C1 functions as a buffer circuit. The power supply line V5A determines a potential of the signal "H" supplied to the gate of the transistor 22B and the gate of the transistor 23B. The transistor 24G is a diode-connected transistor, and the current supply capability of the transistor 24G determines the switching speed of the transistor 24E. Note that the capacitor 24H has a function of bootstrapping and increases a potential supplied to the gate of the transistor 24E, and thus the capacitor 24H has an effect of increasing the current supply capability of the transistor 24E. Charge and discharge of the gate of the transistor 22B and the gate of the transistor 23B can be performed rapidly. Note that it is preferable that the potential supplied to the power supply line V4A be higher than the potential supplied to the power supply line V5A. Alternatively, the potential supplied to the power supply line V4A may be equal to the potential supplied to the power supply line V5A. When the same potential is employed, the number of kinds of power supplies used can be reduced.

Note that as the operational amplifier 11B1 included in the receiving circuit 10A or a plurality of transistors included in the circuit 14A, a transistor including an oxide semiconductor in a semiconductor layer where a channel formation region is formed is preferably used.

Figure 3A:
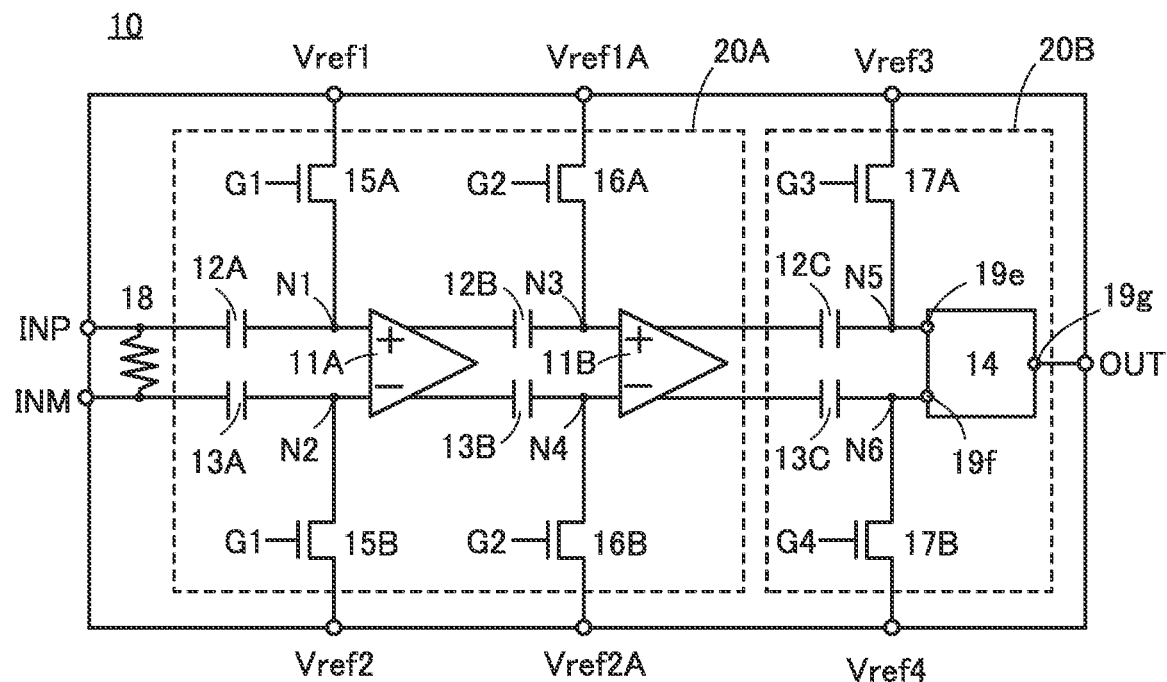
FIG. 3 (A) (B) Diagrams each illustrating a receiving circuit.
Figure 3B:
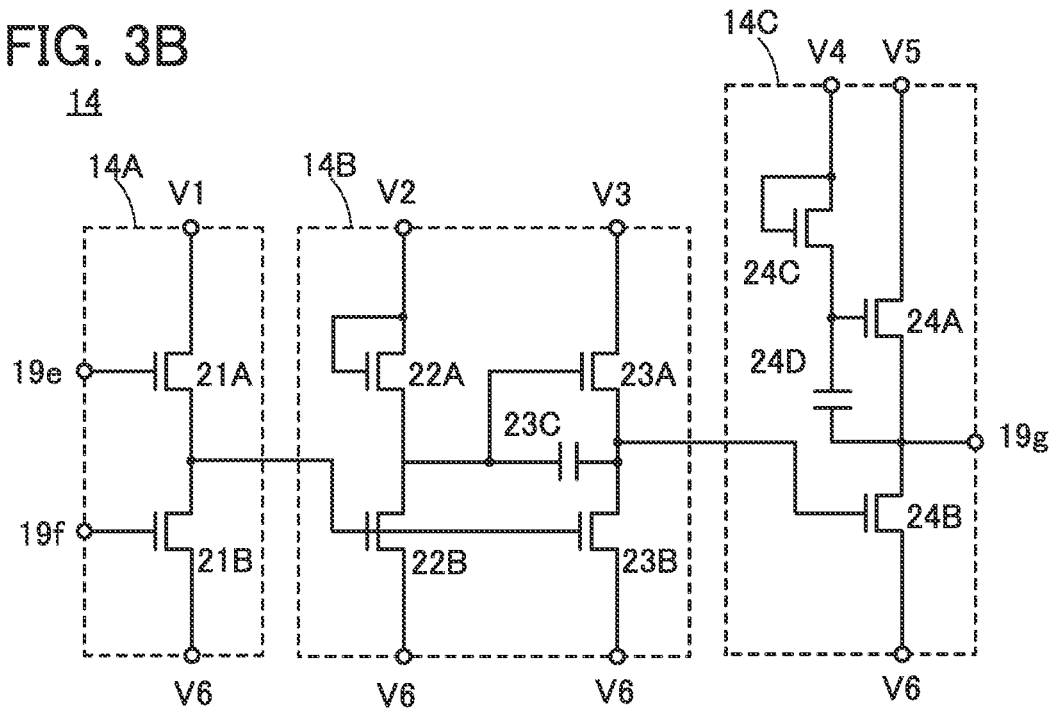
Figure 6:
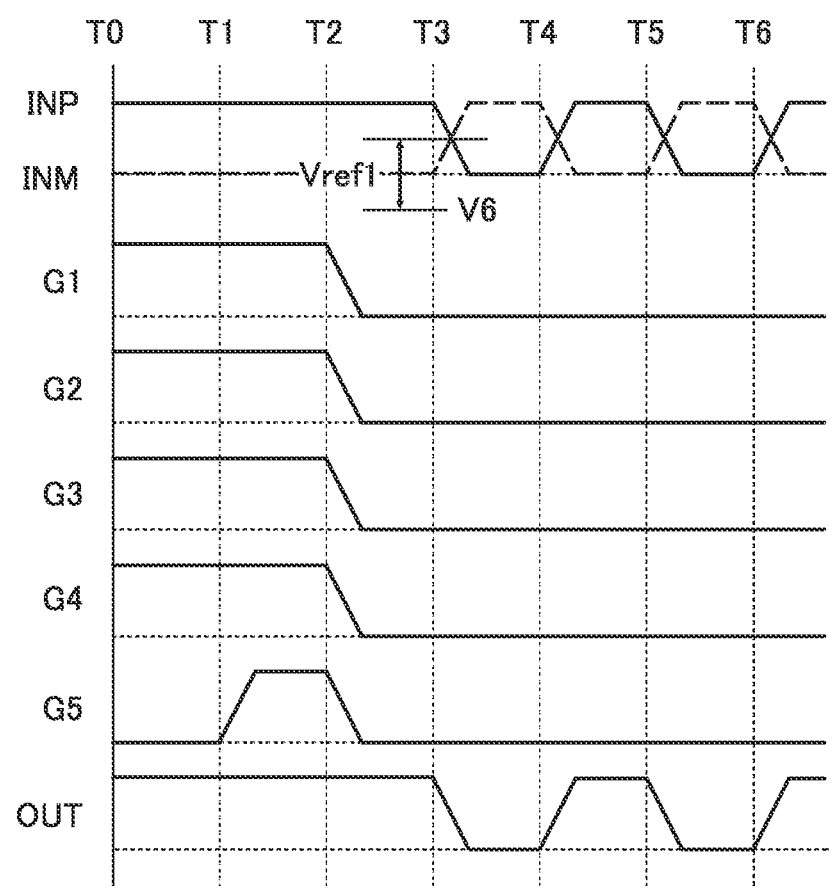
FIG. 6 A timing chart showing operations of a receiving circuit.

Operation of the receiving circuit 10 described with FIG. 3(A) is described with reference to the timing chart in FIG. 6.

At Time T0, the signal "H" is supplied to the input terminal INP, the signal "L" is supplied to the input terminal INM, the signal "H" is supplied to the signal line G1, the signal "H" is supplied to the signal line G2, the signal "H" is supplied to the signal line G3, the signal "H" is supplied to the signal line G4, and the signal "L" is supplied to the signal line G5. For example, the potential of the signal "H" supplied to the signal line G1 is preferably higher than or equal to the potential of the power supply line V2. The potential of the signal "H" supplied to the signal line G2 is preferably higher than or equal to the potential of the power supply line V3. The potential of the signal "H" supplied to the signal line G3 is preferably higher than or equal to the potential of the power supply line V4. The potential of the signal "H" supplied to the signal line G4 is preferably higher than or equal to the potential of the power supply line V3. The potential of the signal "H" supplied to the signal line G5 is preferably the potential of the power supply line V6.

As the signals suppled to the input terminal INP and the input terminal INM, potentials based on the differential signaling standard are preferably supplied. For example, in the case of LVDS, in a period during which a potential of 1.4 V is supplied to the input terminal INP, 1.05 V is supplied to the input terminal INM. Alternatively, in a period during which a potential of 1.05 V is supplied to the input terminal INP, 1.4 V is supplied to the input terminal INM.

For example, it is preferable that by a signal supplied to the signal line G1 or the signal line G2, the program potential Vref1 supplied to the node N1 be supplied using the power supply line V6 as a reference, the program potential Vref2 supplied to the node N2 be supplied using the power supply line V6 as a reference, the program potential Vref1A supplied to the node N3 be supplied using the power supply line V6 as a reference, and the program potential Vref2A supplied to the node N4 be supplied using power supply line V6 as a reference. Note that FIG. 6 shows an example in which a potential the same as the program potential Vref1 is supplied as the program potentials Vref2, Vref1A, and Vref2A.

At Time T1, the signal "H" is supplied to the signal line G5. The magnitude of the signal supplied to the signal line G5 is preferably greater than that of the power supply line V3. When the signal "H" is supplied to the signal line G5, the transistor 36 and the transistor 37 are turned on and the potential of the power supply line V3 is supplied to the gate of the transistor 31 and the gate of the transistor 32.

At Time T2, the signal "L" is supplied to the signal line G1, the signal "L" is supplied to the signal line G2, the signal "L" is supplied to the signal line G3, the signal "L" is supplied to the signal line G4, and the signal "L" is supplied to the signal line G5. The magnitude of each of the signals supplied to the signal line G1 to the signal line G5 is preferably a potential the same as the potential supplied to the power supply line V6. When the signal "L" is supplied to the signal line G5, the transistor 36 and the transistor 37 are turned off, the gate of the transistor 31 and the gate of the transistor 32 are brought into a floating state, and the potential supplied to the power supply line V3 is held. Thus, the transistor 31 and the transistor 32 function as current sources of output signals output to the output terminal 11A3 and the output terminal 11A4, respectively. Note that the potential supplied to the gate of the transistor 31 or the gate of the transistor 32 is increased by bootstrapping using the capacitor 38 or the capacitor 39. Thus, the current supply capability of the transistor 31 or the transistor 32 is increased.

At Time T3, the signal "L" is supplied to the input terminal INP, and the signal "H" is supplied to the input terminal INM. The signal "L" is output to the output terminal OUT.

At Time T4, the signal "H" is supplied to the input terminal INP, and the signal "L" is supplied to the input terminal INM. The signal "H" is output to the output terminal OUT.

After Time T5, the output terminal OUT is determined by a signal supplied to the input terminal INP or the input terminal INM.

The receiving circuit 10 can cancel variations or an offset component included in the receiving circuit 10. Accordingly, the first signal or the second signal received through differential signaling can be correctly converted into the third signal which is a single-ended signal.

Figure 7:
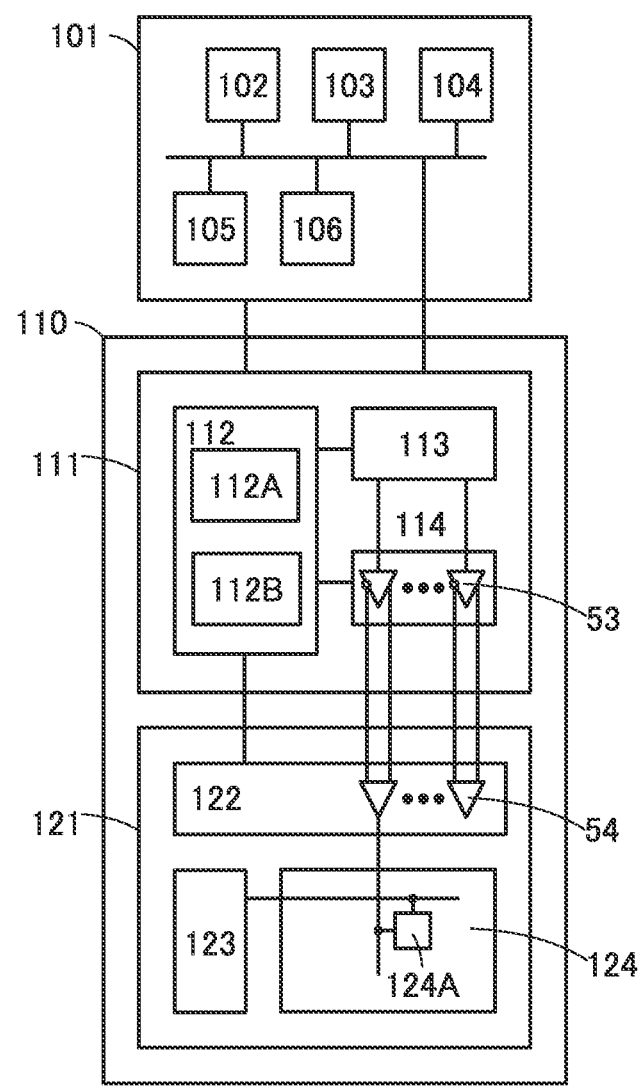
FIG. 7 A diagram illustrating an electronic device.

An electronic device including the receiving circuit of this embodiment is described in detail with reference to FIG. 7. An electronic device 100 preferably includes a control unit 101 and a display device 110. The control unit 101 includes a processor 102, a communication circuit 103, an input/output circuit 104, a storage 105, a memory 106, and the like. The communication circuit 103 preferably has a function of wire communication and wireless communication. The input/output circuit 104 can include a sensor (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), an image sensor, a keyboard, and the like.

The display device 110 includes a display controller 111 and a display panel 121. The display controller 111 includes a control unit 112, a frame memory 113, and a driver circuit 114. The control unit 112 includes an arithmetic unit 112A and a timing generation circuit 112B. The driver circuit 114 includes a plurality of transmitting circuits 53.

The display panel 121 includes a source driver circuit 122, a gate driver circuit 123, and a display portion 124. The source driver circuit 122 includes a plurality of receiving circuits 54. Note that the receiving circuit 54 corresponds to the receiving circuit 10 described in this embodiment. The display portion 124 includes a plurality of pixels 124A.

The display controller 111 transmits an image signal stored in the frame memory 113 to the receiving circuit 54 by using the transmitting circuit 53. Note that the transmitting circuit 53 converts the image signal into the first signal which is a differential signal and transmits it.

The receiving circuit 54 can convert the first signal or the second signal received through differential signaling into the third signal which is a single-ended signal. The source driver circuit 122 can convert the third signal into an analog signal. A pixel selected by the gate driver circuit 123 is supplied with the third signal, and the pixel can perform display on the basis of the third signal.

Figure 8A:
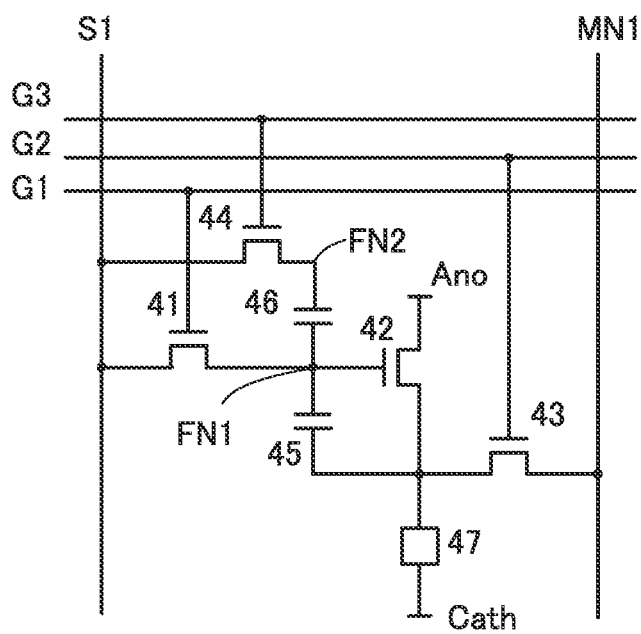
FIG. 8 (A) (B) Diagrams each illustrating a pixel.

The pixel 124A included in the display portion 124 of the display panel 121 is described in detail with reference to the circuit diagram in FIG. 8(A). To the pixel 124A, the signal line G1, the signal line G2, the signal line G3, a wiring S1, a wiring MN1, a wiring Ano, and a wiring Cath are connected. The pixel 124A includes a transistor 41, a transistor 42, a transistor 43, a transistor 44, a capacitor 45, a capacitor 46, and a light-emitting element 47. Note that the pixel 124A may have a structure without including the transistor 44 and the capacitor 46.

A gate of the transistor 41 is electrically connected to the signal line G1. One of a source and a drain of the transistor 41 is electrically connected to the wiring S1. The other of the source and the drain of the transistor 41 is electrically connected to a gate of the transistor 42, one electrode of the capacitor 45, and one electrode of the capacitor 46.

One of a source and a drain of the transistor 42 is electrically connected to one electrode of the light-emitting element 47, one of a source and a drain of the transistor 43, and the other electrode of the capacitor 45. The other of the source and the drain of the transistor 42 is electrically connected to the wiring Ano. The other electrode of the light-emitting element 47 is electrically connected to the wiring Cath. The other of the source and the drain of the transistor 43 is electrically connected to the wiring MN1.

A gate of the transistor 44 is electrically connected to the signal line G3. One of a source and a drain of the transistor 44 is electrically connected to the wiring S1. The other of the source and the drain of the transistor 44 is electrically connected to the other electrode of the capacitor 46.

A node FN1 is a wiring to which the gate of the transistor 42, the one electrode of the capacitor 45, and the one electrode of the capacitor 46 are connected. A node FN2 is a wiring to which the other of the source and the drain of the transistor 44 and the other electrode of the capacitor 46 are connected.

The pixel 124A is supplied with different scan signals from the gate driver circuit 123 through the signal line G1, the signal line G2, and the signal line G3. The pixel 124A is supplied with an image signal through the wiring S1. The pixel 124A can monitor current flowing therethrough through the wiring MN1 as an observation signal. Note that the observation signal is either current flowing through the transistor 43 or current flowing through the light-emitting element 47.

Figure 8B:
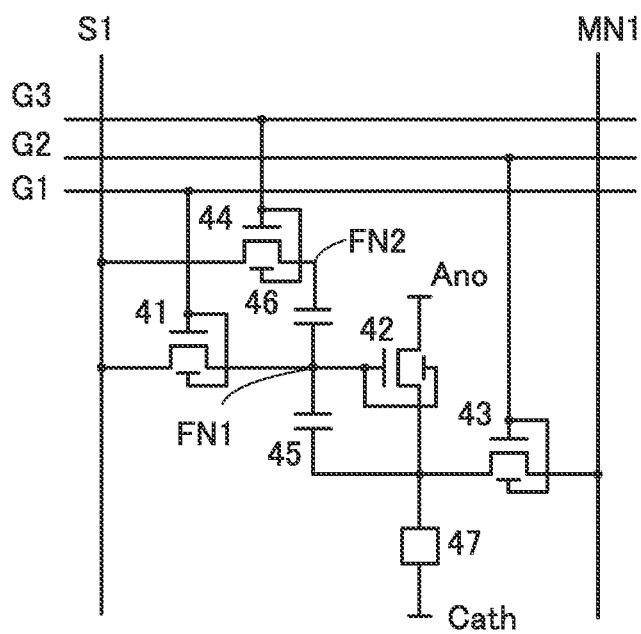

The pixel 124B is described in detail with reference to the circuit diagram in FIG. 8(B). Here, portions different from those of the pixel 124A in FIG. 8(A) are described. The pixel 124B is different in that one or more of the transistor 41, the transistor 42, the transistor 43, and the transistor 44 include a back gate. Note that FIG. 8(B) illustrates an example in which all the transistors include back gates. The transistor including a back gate can increase the on-state current. Moreover, the threshold of the transistor can be controlled.

Note that it is preferable that the display panel 121, the operational amplifier 11 including the receiving circuit 10 included in the gate driver circuit 123, the display portion 124, and the source driver circuit, and a plurality of transistors included in the circuit 14 be formed over the same substrate.

Note that the transistor preferably includes an oxide semiconductor in a semiconductor layer where a channel formation region is formed. The transistor can have a low off-state current. Thus, the retention time of the program potential, the preset potential, the image signal, or the like can be prolonged. The frequency of refresh operation can be reduced, which leads to lower power consumption. The transistor including an oxide semiconductor in a semiconductor layer is described in detail in Embodiment 5.

Alternatively, silicon may be used for a semiconductor layer in a channel formation region of a transistor. As the silicon, amorphous silicon may be used but silicon having crystallinity is preferably used. For example, microcrystalline silicon, polycrystalline silicon, or single-crystal silicon is preferably used. In particular, polycrystalline silicon can be formed at a lower temperature than single-crystal silicon and has higher field-effect mobility and higher reliability than amorphous silicon.

The structure and method described in this embodiment can be used by being combined as appropriate with the structures and methods described in the other embodiments.

Embodiment 2

In this embodiment, a structure example of a display device using a liquid crystal element and a structure example of a display device using a light-emitting element are described. Note that the description of the components, operations, and functions of the display device described in Embodiment 1 is omitted in this embodiment.

Figure 9A:
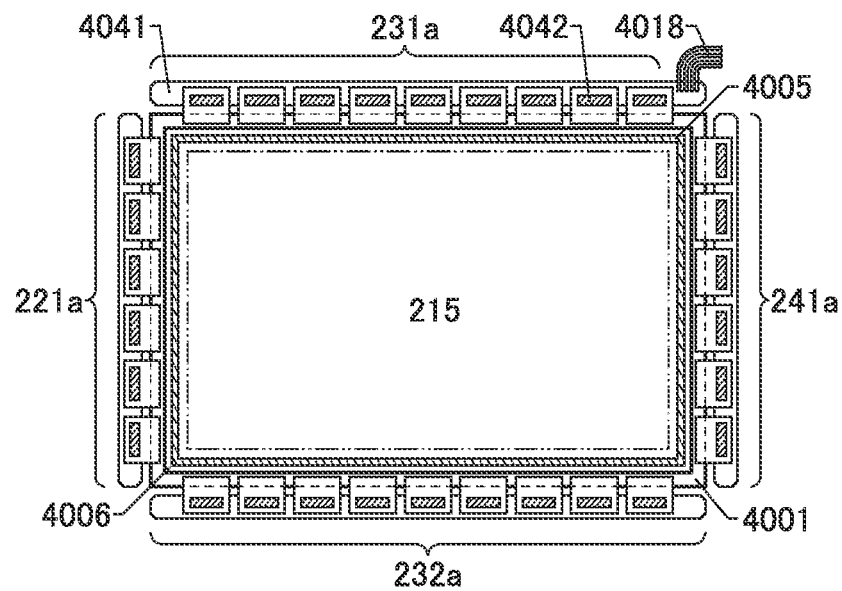
FIG. 9 (A) (B) (C) Diagrams each illustrating a display device.
Figure 9B:
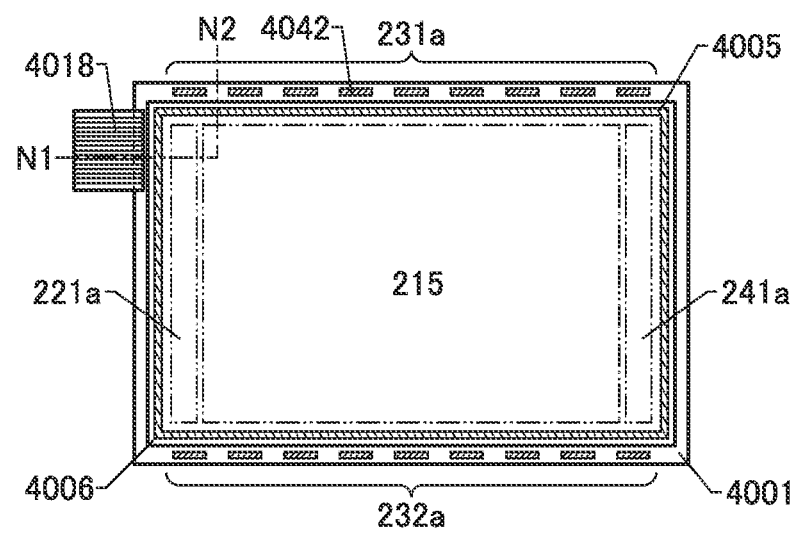
Figure 9C:
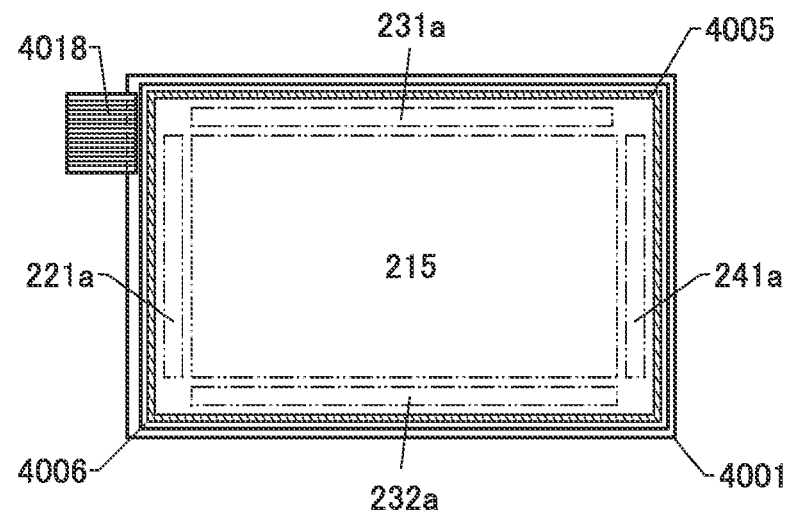

The receiving circuit described in Embodiment 1 can be used in the display device described in this embodiment. Note that a scan line driver circuit and a signal line driver circuit which are described below correspond to the gate driver circuit and the source driver circuit, respectively. FIGS. 9(A), 9(B), and 9(C) illustrate a display device.

In FIG. 9(A), a sealant 4005 is provided to surround a display portion 215 provided over a first substrate 4001, and the display portion 215 is sealed with the sealant 4005 and a second substrate 4006.

In FIG. 9(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings Ano, Cath, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

FIG. 9(B) illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 9(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 9(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Although the signal line driver circuit 231a and the signal line driver circuit 232a are separately formed and mounted on the first substrate 4001 in the example illustrated in FIG. 9(B), one embodiment of the present invention is not limited to this structure. The scan line driver circuit may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as illustrated in FIG. 9(C).

In some cases, the display device encompasses a display panel in which the display element is sealed, and a module in which an IC or the like including a controller is mounted on the display panel.

The display portion and the scan line driver circuit provided over the first substrate each include a plurality of transistors. As the transistors, the transistor described in the above embodiment can be used.

Transistors included in a peripheral driver circuit and transistors included in the pixel circuits of the display portion may have the same structure or different structures. The transistors included in the peripheral driver circuit may have the same structure or a combination of two or more kinds of structures. Similarly, the transistors included in the pixel circuits may have the same structure or a combination of two or more kinds of structures.

An input device 4200 can be provided over the second substrate 4006. The display devices illustrated in FIGS. 9(A) to 9(C) and provided with an input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 10A:
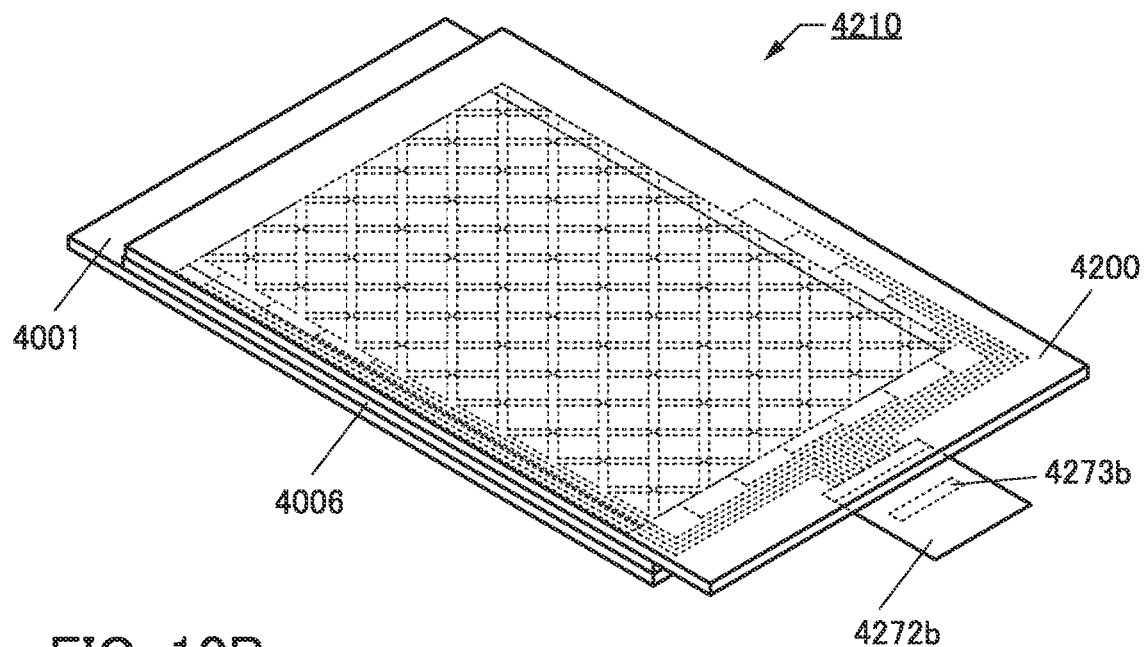
FIG. 10 (A) (B) Diagrams each illustrating a touch panel.
Figure 10B:
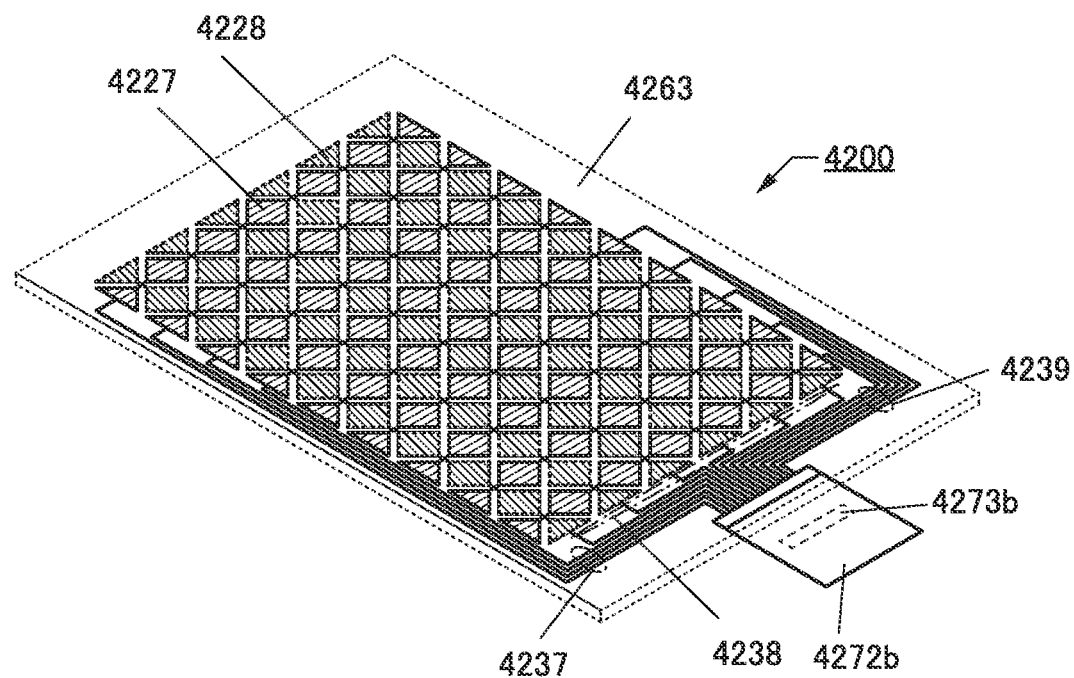

FIGS. 10(A) and 10(B) each illustrate an example of a touch panel. FIG. 10(A) is a perspective view of a touch panel 4210. FIG. 10(B) is a schematic perspective view of the input device 4200. Note that for clarity, only typical components are illustrated.

The touch panel 4210 has a structure in which a display device and a sensor element that are separately formed are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIGS. 11(A) and 11(B) are cross-sectional views each illustrating a display device. FIGS. 11(A) and 11(B) are cross-sectional views of a portion indicated by a dashed-dotted line N1-N2 in FIG. 9(B). Display devices illustrated in FIGS. 11(A) and 11(B) each include an electrode 4015, and the electrode 4015 is electrically connected to a terminal included in the FPC 4018 through an anisotropic conductive layer 4019. In FIGS. 11(A) and 11(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors, and in FIGS. 11(A) and 11(B), the transistor 4010 included in the display portion 215 and the transistor 4011 included in the scan line driver circuit 221a are illustrated as an example. Note that in the examples illustrated in FIGS. 11(A) and 11(B), the transistor 4010 and the transistor 4011 are bottom-gate transistors but may be top-gate transistors.

In FIGS. 11(A) and 11(B), the insulating layer 4112 is provided over the transistor 4010 and the transistor 4011. In FIG. 11(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display devices illustrated in FIGS. 11(A) and 11(B) each include a capacitor 4020. The capacitor 4020 includes an electrode 4021 formed in the same step as a gate electrode of the transistor 4010 and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor may be set in consideration of the off-state current of the transistors or the like.

The transistor 4010 provided in the display portion 215 is electrically connected to the display element. FIG. 11(A) is an example of a liquid crystal display device using a liquid crystal element as the display element. In FIG. 11(A), a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal element having a variety of modes can be used as the liquid crystal element 4013. For example, a liquid crystal element using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used.

As the liquid crystal display device described in this embodiment, a normally black liquid crystal display device such as a transmissive liquid crystal display device employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal element is an element that controls the transmission and non-transmission of light utilizing an optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although FIGS. 11(A) and 11(B) illustrate an example of a liquid crystal display device including a liquid crystal element with a vertical electric field mode, a liquid crystal display device including a liquid crystal element with a horizontal electric field mode can be applied to one embodiment of the present invention. In the case of employing a horizontal electric field mode, a liquid crystal exhibiting a blue phase for which an alignment film is not used may be used. The blue phase is one of the liquid crystal phases, which appears just before a cholesteric phase changes into an isotropic phase when the temperature of a cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains a liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device illustrated in FIG. 11(A), a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the common material because the common manufacturing apparatus can be used and the process can be simplified.

Examples of a material that can be used for the coloring layer include a metal material, a resin material, and a resin material containing a pigment or a dye. The light-blocking layer and the coloring layer may be formed by a method similar to the above-described methods for forming each layer. For example, an inkjet method may be used.

The display devices illustrated in FIGS. 11(A) and 11(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

As the display element included in the display device, a light-emitting element can be used. As the light-emitting element, for example, an EL element that utilizes electroluminescence can be used. An EL element includes a layer containing a light-emitting compound (also referred to as an "EL layer") between a pair of electrodes. A potential difference greater than the threshold voltage of the EL element is generated between the pair of electrodes, whereby holes are injected to the EL layer from the anode side and electrons are injected from the cathode side. The injected electrons and holes are recombined in the EL layer and the light-emitting substance contained in the EL layer emits light.

EL elements are classified depending on whether a light-emitting material is an organic compound or an inorganic compound; in general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting element is referred to as a current-excitation light-emitting element.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 11(B) is an example of a light-emitting display device using a light-emitting element as a display element (also referred to as an "EL display device"). A light-emitting element 4513 serving as the display element is electrically connected to the transistor 4010 provided in the display portion 215. Note that the structure of the light-emitting element 4513 is a stacked-layer structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. The partition wall 4510 is preferably formed in such a manner that it is formed using, especially, a photosensitive resin material, and an opening portion is formed over the first electrode layer 4030 such that a side surface of the opening portion slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 that emits white light is combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, what is called a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 12:
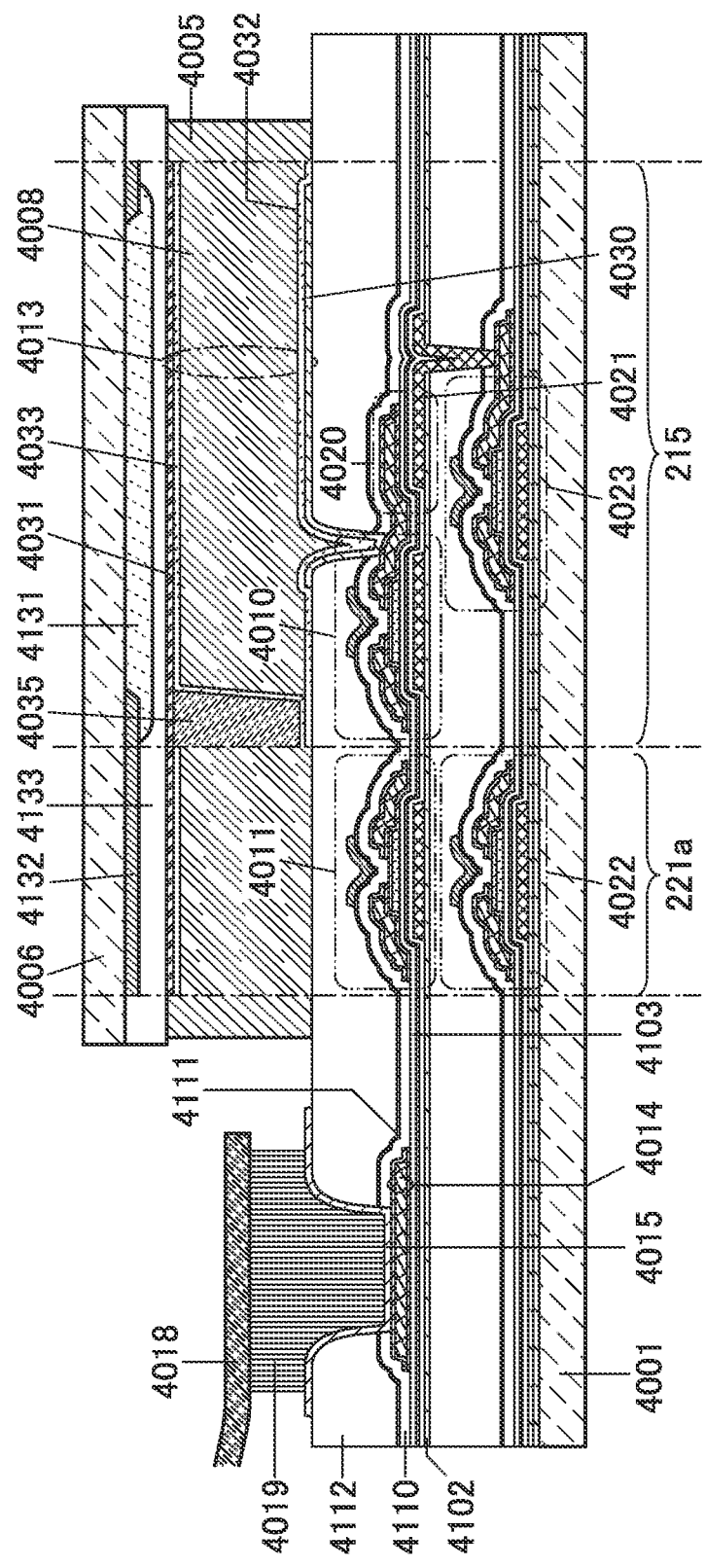
FIG. 12 A diagram illustrating a display device.

Note that as illustrated in FIG. 12, a stacked structure including a region where a transistor and a capacitor overlap with each other in the height direction may be employed. For example, when the transistor 4011 and a transistor 4022 included in the driver circuit are provided to overlap with each other, a display device with a narrow bezel can be provided. Furthermore, when the transistor 4010, a transistor 4023, the capacitor 4020, and the like included in the pixel circuit are provided to at least partly overlap with each other, the aperture ratio and the resolution can be improved. Although FIG. 12 illustrates an example in which the stacked structure is employed for the liquid crystal display device illustrated in FIG. 11(A), the stacked structure may be employed for the EL display device illustrated in FIG. 11(B).

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display device may have a structure with a combination of a liquid crystal display device and a light-emitting device.

The light-emitting device is disposed on the side opposite to the display surface or on an end portion of the display surface. The light-emitting device has a function of supplying light to the display element. The light-emitting device can also be referred to as a backlight.

Here, the light-emitting device can include a plate-like or sheet-like light guide portion (also referred to as a light guide plate) and a plurality of light-emitting elements which emit light of different colors. When the light-emitting elements are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting device to emit light uniformly to a pixel portion of a display panel. Alternatively, the light-emitting device may be provided directly under the pixel without providing the light guide portion.

The light-emitting device preferably includes light-emitting elements of three colors: red (R), green (G), and blue (B). In addition, a light-emitting element of white (W) may be included. A light emitting diode (LED) is preferably used as these light-emitting elements.

Furthermore, the light-emitting elements preferably have extremely high color purities; the full width at half maximum (FWHM) of the emission spectrum of the light-emitting element is less than or equal to 50 nm, preferably less than or equal to 40 nm, more preferably less than or equal to 30 nm, still more preferably less than or equal to 20 nm. Note that the full width at half maximum of the emission spectrum is preferably as small as possible, and can be, for example, greater than or equal to 1 nm. Thus, when color display is performed, a vivid image with high color reproducibility can be displayed.

As the red light-emitting element, an element whose wavelength of an emission spectrum peak is in a range from 625 nm to 650 nm is preferably used. As the green light-emitting element, an element whose wavelength of an emission spectrum peak is in a range from 515 nm to 540 nm is preferably used. As the blue light-emitting element, an element whose wavelength of an emission spectrum peak is in a range from 445 nm to 470 nm is preferably used.

The display device can make the light-emitting elements for the three colors blink sequentially, drive the pixels in synchronization with these light-emitting elements, and perform color display on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, color filters do not need to be provided for the pixels, which can improve the transmittance and achieve brighter image display. In addition, the manufacturing process can be simplified, and thus the manufacturing costs can be reduced.

FIGS. 13(A) and 13(B) are each an example of a schematic cross-sectional view of a display device capable of the field-sequential driving. A backlight unit capable of emitting light of RGB colors is provided on the substrate 4001 side of the display device. Note that in the field-sequential driving, the RGB colors are expressed through time division light emission, and thus color filters are not needed.

A backlight unit 4340a illustrated in FIG. 13(A) has a structure in which a plurality of light-emitting elements 4342 are provided directly under a pixel with a diffusing plate 4352 positioned therebetween. The diffusing plate 4352 have functions of diffusing light emitted from the light-emitting element 4342 to the substrate 4001 side and making the luminance in a display portion uniform. Between the light-emitting element 4342 and the diffusing plate 4352, a polarizing plate may be provided if necessary. The diffusing plate 4352 is not necessarily provided if not needed. The light-blocking layer 4132 may be omitted.

The backlight unit 4340a can include a large number of light-emitting elements 4342, which enables bright image display. Moreover, there are advantages that a light guide plate is not needed and light efficiency of the light-emitting element 4342 is less likely to be lowered. Note that the light-emitting element 4342 may be provided with a light diffusion lens 4344 if necessary.

A backlight unit 4340b illustrated in FIG. 13(B) has a structure in which a light guide plate 4341 is provided directly under a pixel with the diffusing plate 4352 positioned therebetween. The plurality of light-emitting elements 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting element 4342 can be fixed to a printed circuit board 4347. Note that in FIG. 13(B), the light-emitting elements 4342 of RGB colors overlap with each other; however, the light-emitting elements 4342 of RGB colors can be arranged to be lined up in the depth direction. A reflective layer 4348 that reflects visible light may be provided on the side surface of the light guide plate 4341 which is opposite to the light-emitting element 4342.

The backlight unit 4340b can reduce the number of light-emitting elements 4342, leading to reductions in cost and thickness.

A light-scattering liquid crystal element may be used as the liquid crystal element. The light-scattering liquid crystal element is preferably an element containing a composite material of liquid crystal and a polymer molecule. For example, a polymer dispersed liquid crystal element can be used. Alternatively, a polymer network liquid crystal (PNLC) element may be used.

The light-scattering liquid crystal element has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal element performs display by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal element, a difference in a refractive index between the liquid crystal portion and the resin portion becomes small, and incident light along the direction passes without being scattered in the liquid crystal portion. Thus, the light-scattering liquid crystal element is perceived in a transparent state from the direction. In contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal element is in an opaque state regardless of the viewing direction.

FIG. 14(A) illustrates a structure in which the liquid crystal element 4013 of the display device illustrated in FIG. 13(A) is replaced with a light-scattering liquid crystal element 4016. The light-scattering liquid crystal element 4016 includes a composite layer 4009 including a liquid crystal portion and a resin portion and electrode layers 4030 and 4031. Although components relating to the field-sequential driving are the same as those in FIG. 13(A), when the light-scattering liquid crystal element 4016 is used, an alignment film and a polarizing plate are not necessary. Note that the spacer 4035 is illustrated as having a spherical shape, but the spacer 4035 may have a columnar shape.

FIG. 14(B) illustrates a structure in which the liquid crystal element 4013 of the display device illustrated in FIG. 13(B) is replaced with the light-scattering liquid crystal element 4016. In the structure of FIG. 13(B), it is preferable that light be transmitted when a voltage is not applied to the light-scattering liquid crystal element 4016, and light be scattered when a voltage is applied. With such a structure, the display device can be transparent in a normal state (without display). In that case, color display can be performed when light scattering operation is performed.

FIGS. 15(A) to 15(E) illustrate modification examples of the display device in FIG. 14(B). Note that in FIGS. 15(A) to 15(E), some components in FIG. 14(B) are used and the other components are not illustrated for simplicity.

Figure 15A:
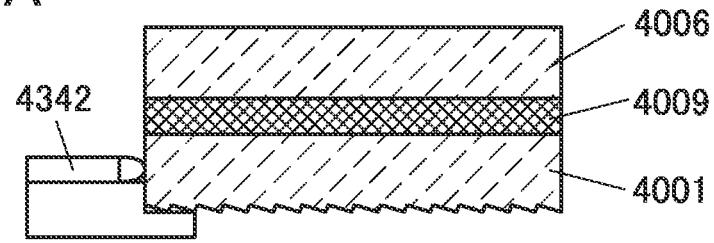
FIG. 15 (A) to (E) Diagrams each illustrating a display device.

FIG. 15(A) illustrates a structure in which the substrate 4001 has a function of a light guide plate. An outer surface of the substrate 4001 may have an uneven shape. With this structure, a light guide plate does not need to be provided additionally, leading to a reduction in a manufacturing cost. Furthermore, the attenuation of light caused by the light guide plate also does not occur; accordingly, light emitted from the light-emitting element 4342 can be efficiently utilized.

Figure 15B:
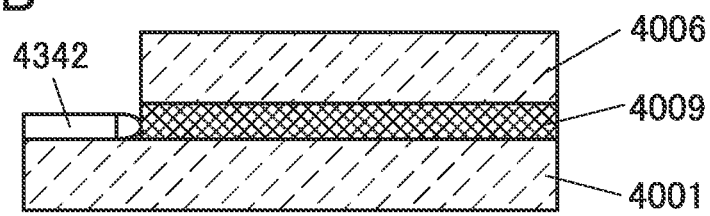

FIG. 15(B) illustrates a structure in which light enters from the vicinity of an end portion of the composite layer 4009. By utilizing total reflection at the interface between the composite layer 4009 and the substrate 4006 and the interface between the composite layer 4009 and the substrate 4001, light can be emitted to the outside from the light-scattering liquid crystal element. For the resin portion of the composite layer 4009, a material having a refractive index higher than that of the substrate 4001 and that of the substrate 4006 is used.

Figure 15C:
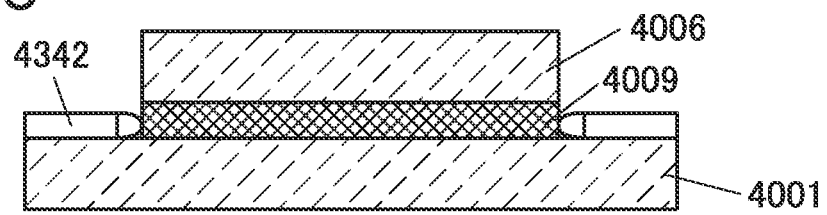

Note that the light-emitting element 4342 is not limited to be provided on one side of the display device, and may be provided on each of two sides facing each other as illustrated in FIG. 15(C). Furthermore, the light-emitting elements 4342 may be provided on three sides or four sides. When the light-emitting elements 4342 are provided on a plurality of sides, attenuation of light can be compensated for and application to a large-area display element is possible.

Figure 15D:
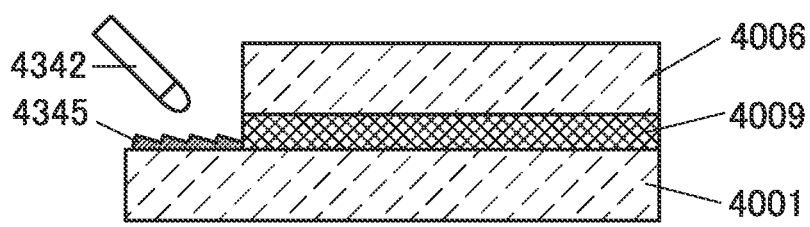

FIG. 15(D) illustrates a structure in which light emitted from the light-emitting element 4342 is guided to the display device through a mirror 4345. With this structure, light can be guided easily with a certain angle to the display device; thus, total reflection light can be obtained efficiently.

Figure 15E:
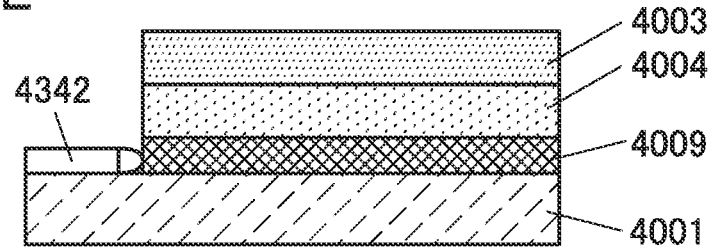

FIG. 15(E) illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through without being totally reflected at the first interface is totally reflected at the second interface and can be returned to the composite layer 4009. Accordingly, light emitted from the light-emitting element 4342 can be efficiently utilized.

Note that the structures in FIG. 14(B) and FIGS. 15(A) to 15(E) can be combined with each other.

This embodiment can be implemented in combination with any of the structures described in the other embodiments and the like, as appropriate.

Embodiment 3

In this embodiment, examples of transistors which can be used instead of the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 16(A1) is a cross-sectional view of a channel-protective transistor 810, which is a type of bottom-gate transistor, in the channel length direction. In FIG. 16(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided to be partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions (n+ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 16(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is sandwiched between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 positioned therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and degradation of electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 16(B1) is a cross-sectional view of a channel-protective transistor 820, which has a structure different from FIG. 16(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 729 that overlaps with the channel formation region can function as a channel protective layer.

A transistor 821 illustrated in FIG. 16(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

A transistor 825 illustrated in FIG. 16(C1) is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 illustrated in FIG. 16(C2) is different from the transistor 825 in that the electrode 723 that can function as a back gate electrode is provided over the insulating layer 729.

FIGS. 17(A1), 17(A2), 17(B1), 17(B2), 17(C1), and 17(C2) are cross-sectional views of the transistors 810, 811, 820, 821, 825, and 826 in the channel width direction, respectively.

In each of the structures illustrated in FIGS. 17(B2) and 17(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode or the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 where the channel formation region is formed is electrically surrounded by electric fields of the gate electrode and the back gate electrode, as in the transistor 821 or the transistor 826, can be referred to as a surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 18(A1) is a type of top-gate transistor. The transistor 842 is different from the transistor 810 and the transistor 820 in that the electrode 744a and the electrode 744b are formed after the insulating layer 729 is formed. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity 755 is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. An LDD (Lightly Doped Drain) region is formed in the region of the semiconductor layer 742 that does not overlap with the electrode 746.

A transistor 843 illustrated in FIG. 18(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 positioned therebetween. The electrode 723 can function as a back gate electrode.

As in a transistor 844 illustrated in FIG. 18(B1) and a transistor 845 illustrated in FIG. 18(B2), the insulating layer 726 in a region that does not overlap with the electrode 746 may be completely removed. Alternatively, as in a transistor 846 illustrated in FIG. 18(C1) and a transistor 847 illustrated in FIG. 18(C2), the insulating layer 726 may be left.

Also in the transistor 842 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 19(A1), 19(A2), 19(B1), 19(B2), 19(C1), and 19(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 20(A) to 20(F) illustrate specific examples of such electronic devices.

Figure 20A:
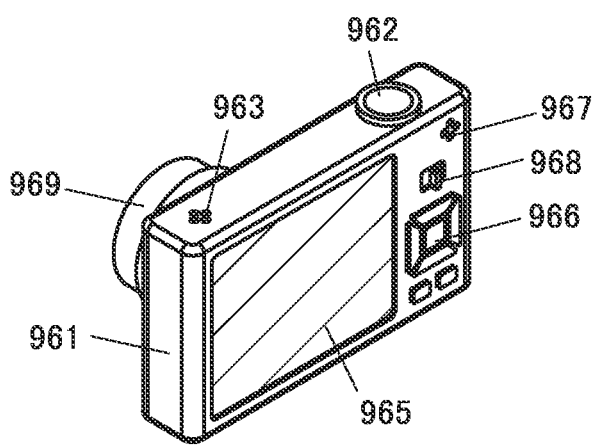
FIG. 20 (A) to (F) Diagrams each illustrating an electronic device.

FIG. 20(A) is a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 20B:
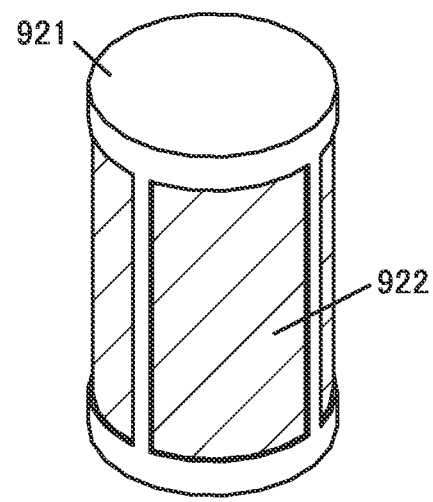

FIG. 20(B) is a digital signage, which has large display portions 922 attached on the side surface of a pillar 921. The use of the display device of one embodiment of the present invention for the display portion 922 enables display with high display quality.

Figure 20C:
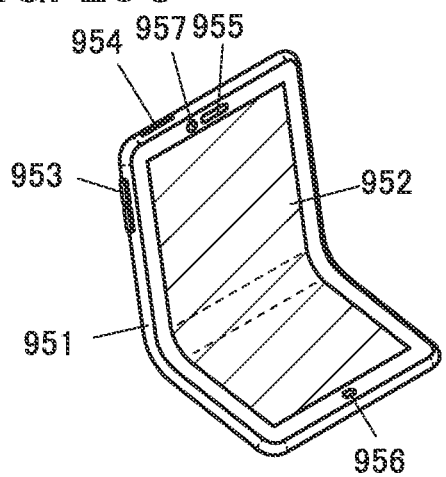

FIG. 20(C) is an example of a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as illustrated in the drawing. The use of the display device of one embodiment of the present invention for the display portion 952 enables display of a variety of images.

Figure 20D:
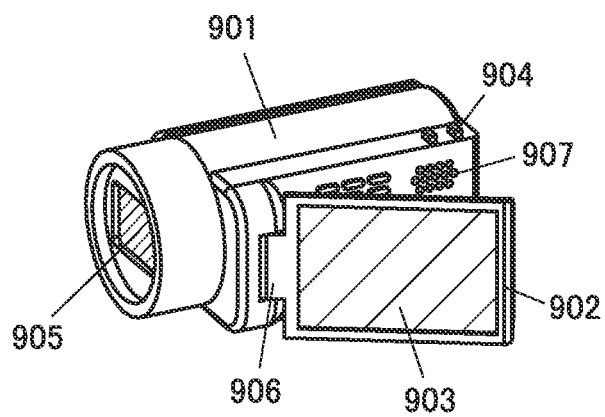

FIG. 20(D) is a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The use of the display device of one embodiment of the present invention for the display portion 903 enables display of a variety of images.

Figure 20E:
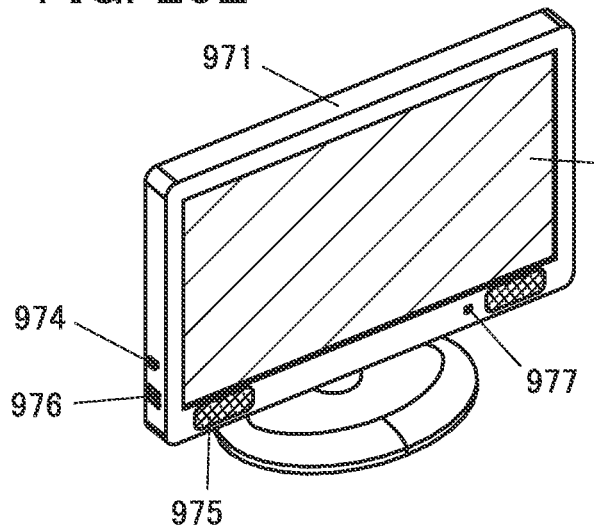

FIG. 20(E) is a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 20F:
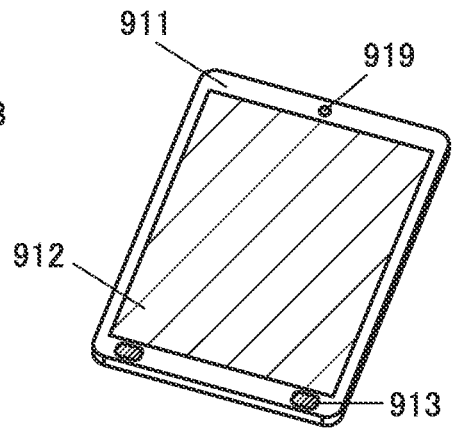

FIG. 20(F) is a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

This embodiment can be implemented in combination with any of the structures described in the other embodiments and the like, as appropriate.

Embodiment 5

In this embodiment, a metal oxide that can be favorably used for a channel formation region of a transistor is described.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratios of metal elements of the sputtering targets in a range of ±40%.

A metal oxide film with low carrier density is used for the semiconductor layer. For example, the semiconductor layer can include a metal oxide whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such a metal oxide is referred to as a highly purified intrinsic or substantially highly purified intrinsic metal oxide. The metal oxide has a low density of defect states and thus can be regarded as a metal oxide semiconductor having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the metal oxide included in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to a metal oxide, in which case the off-state current of the transistor might be increased. Thus, the concentration of alkali metal or alkaline earth metal of the semiconductor layer, which is measured by secondary ion mass spectrometry, is set to lower than or equal to $1\times10^{18}$ atoms/cm$^3$, preferably lower than or equal to $2\times10^{16}$ atoms/cm$^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to be normally on. Hence, the concentration of nitrogen which is measured by secondary ion mass spectrometry is preferably set to lower than or equal to $5\times10^{18}$ atoms/cm$^3$.

Oxide semiconductors are classified into a single crystal oxide semiconductor and a non-single-crystal oxide semiconductor. Examples of a non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

For a semiconductor layer of a transistor disclosed in one embodiment of the present invention, the above-described non-single-crystal oxide semiconductor or a CAC-OS can be suitably used. As the non-single-crystal oxide semiconductor, an nc-OS or a CAAC-OS can be suitably used.

In one embodiment of the present invention, a CAC-OS is preferably used for a semiconductor layer of a transistor. The use of a CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

The composition of a CAC (Cloud-Aligned Composite)-OS that can be used in a transistor disclosed in one embodiment of the present invention is described below.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that a metal oxide preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that IGZO is a common name and sometimes refers to one compound formed of In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Thus, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

Note that in the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, it is found from the X-ray diffraction measurement that no alignment in the a-b plane direction and the c-axis direction is observed in the measured region.

In an electron diffraction pattern of the CAC-OS which is obtained by irradiation with an electron beam with a probe diameter of 1 nm (also referred to as a nanometer-sized electron beam), a ring-like region with high luminanceand a plurality of bright spots in the ring-like region are observed. Thus, the electron diffraction pattern indicates that the crystal structure of the CAC-OS includes a nanocrystal (nc) structure with no alignment in plan-view and cross-sectional directions.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other and form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow bezel to be provided. Furthermore, the use of the transistor in a signal line driver circuit (particularly in a demultiplexer connected to an output terminal of a shift register included in a signal line driver circuit) in a display device can reduce the number of wirings connected to the display device.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra high definition ("4K resolution", "4K2K", and "4K") or super high definition ("8K resolution", "8K4K", and "8K"), in which case writing can be performed in a short time and display defects can be reduced.

Alternatively, silicon may be used as a semiconductor in which a channel of a transistor is formed. As the silicon, amorphous silicon may be used but silicon having crystallinity is preferably used. For example, microcrystalline silicon, polycrystalline silicon, or single-crystal silicon are preferably used. In particular, polycrystalline silicon can be formed at a lower temperature than single-crystal silicon and has higher field-effect mobility and higher reliability than amorphous silicon.

At least part of this embodiment can be implemented in combination with any of the other embodiments described in this specification as appropriate.

REFERENCE NUMERALS

FN1: node, FN2: node, G1: signal line, G2: signal line, G3: signal line, G4: signal line, G5: signal line, IM1: input terminal, IM2: input terminal, IP1: input terminal, IP2: input terminal, MN1: wiring, N1: node, N2: node, N3: node, N4: node, N5: node, N6: node, OM1: output terminal, OM2: output terminal, OP1: output terminal, OP2: output terminal, V1: power supply line, V2: power supply line, V3: power supply line, V4: power supply line, V4A: power supply line, V5: power supply line, V5A: power supply line, V6: power supply line, V7: power supply line, V8: power supply line, Vre1: program potential, Vref1: program potential, Vref1A: program potential, Vref2: program potential, Vref2A: program potential, Vref3: preset potential, Vref4: preset potential, 10: receiving circuit, 10A: receiving circuit, 11: operational amplifier, 11A: operational amplifier, 11A1: input terminal, 11A2: input terminal, 11A3: output terminal, 11A4: output terminal, 11B: operational amplifier, 11B1: operational amplifier, 12: transistor, 12A: element, 12B: element, 12C: element, 13A: element, 13B: element, 13C: element, 14: circuit, 14A: circuit, 14B: circuit, 14C: circuit, 14C1: circuit, 15: light-emitting element, 15A: transistor, 15B: transistor, 16A: transistor, 16B: transistor, 17a: transistor, 17A: transistor, 17B: transistor, 18: resistor, 19*a*: input terminal, 19A: transistor, 19*b*: input terminal, 19B: transistor, 19*c*: output terminal, 19*d*: output terminal, 19*e*: input terminal, 19*f*: input terminal, 19*g*: output terminal, 19*h*: input terminal, 20A: circuit, 20B: circuit, 21A: transistor, 21B: transistor, 22A: transistor, 22B: transistor, 23A: transistor, 23B: transistor, 23C: capacitor, 24A: transistor, 24B: transistor, 24C: transistor, 24D: capacitor, 24E: transistor, 24F: transistor, 24G: transistor, 24H: capacitor, 31: transistor, 32: transistor, 33: transistor, 34: transistor, 35: transistor, 36: transistor, 37: transistor, 38: capacitor, 39: capacitor, 41: transistor, 42: transistor, 43: transistor, 44: transistor, 45: capacitor, 46: capacitor, 47: light-emitting element, 50: receiving circuit, 51: control unit, 52: control unit, 53: transmitting circuit, 54: receiving circuit, 55: transmission path, 56: transmission path, 57: resistor, 100: electronic device, 101: control unit, 102: processor, 103: communication circuit, 104: input/output circuit, 105: storage, 106: memory, 110: display device, 111: display controller, 112: control unit, 112A: arithmetic unit, 112B: timing generation circuit, 113: frame memory, 114: driver circuit, 121: display panel, 122: source driver circuit, 123: gate driver circuit, 124: display portion, 124A: pixel, 124B: pixel.

The invention claimed is:

1. A receiving circuit converting a first signal and a second signal supplied through differential signaling into a third signal which is a single-ended signal, the receiving circuit comprising an operational amplifier, a first element, a second element, a third element, a first transistor, a first circuit, and a first resistor,
   wherein the operational amplifier comprises a first input terminal, a second input terminal, and a first output terminal,
   wherein the first output terminal of the operational amplifier is electrically connected to one electrode of the first element,
   wherein the other electrode of the first element is electrically connected to the first circuit through a first node,
   wherein the first input terminal of the operational amplifier is electrically connected to one electrode of the second element through a second node,
   wherein the second input terminal of the operational amplifier is electrically connected to one electrode of the third element through a third node,
   wherein the other electrode of the second element is electrically connected to a first transmission path through a first input terminal of the receiving circuit,
   wherein the other electrode of the third element is electrically connected to a second transmission path through a second input terminal of the receiving circuit,
   wherein the first transmission path is electrically connected to the second transmission path through the first resistor,
   wherein one of a source and a drain of the first transistor is electrically connected to the first node,
   wherein the first signal is supplied to the first input terminal of the receiving circuit,
   wherein the second signal that is an inverse of the first signal is supplied to the second input terminal of the receiving circuit,
   wherein the operational amplifier supplies a signal output from the first output terminal to the first element,
   wherein a first preset potential is supplied to the first node through the first transistor,
   wherein a signal including variations of the operational amplifier is stored in the first element in accordance with the first preset potential, and
   wherein the first circuit supplied with the first preset potential determines an initial value of the third signal without being influenced by the signal including variations of the operational amplifier.

2. The receiving circuit according to claim 1,
   wherein the first element is a capacitor,
   wherein the second element is a capacitor, and
   wherein the third element is a capacitor.

3. The receiving circuit according to claim 2,
   wherein the receiving circuit further comprises a second transistor,
   wherein one of a source and a drain of the second transistor is electrically connected to the second node,
   wherein the first signal is supplied to the second element, and
   wherein a first program potential is supplied to the second node through the second transistor.

4. The receiving circuit according to claim 2,
   wherein the receiving circuit further comprises a third transistor,
   wherein the operational amplifier further comprises a second output terminal,
   wherein one of a source and a drain of the third transistor is electrically connected to the third node,
   wherein the second signal is supplied to the third element,
   wherein a second program potential is supplied to the third node through the third transistor,
   wherein variations included in the second signal are stored in the third element in accordance with the second program potential, and
   wherein the operational amplifier supplied with the second program potential outputs a signal including variations of the operational amplifier to the second output terminal without being influenced by variations included in the second signal.

5. The receiving circuit according to claim 1,
   wherein the receiving circuit further comprises a second transistor,
   wherein one of a source and a drain of the second transistor is electrically connected to the second node,
   wherein the first signal is supplied to the second element,
   wherein a first program potential is supplied to the second node through the second transistor,
   wherein variations included in the first signal are stored in the second element in accordance with the first program potential, and
   wherein the operational amplifier supplied with the first program potential outputs a signal including variations of the operational amplifier to the first output terminal without being influenced by variations included in the first signal.

6. The receiving circuit according to claim 5,
   wherein the receiving circuit further comprises a third transistor,
   wherein the operational amplifier further comprises a second output terminal,
   wherein one of a source and a drain of the third transistor is electrically connected to the third node,
   wherein the second signal is supplied to the third element,
   wherein a second program potential is supplied to the third node through the third transistor,
   wherein variations included in the second signal are stored in the third element in accordance with the second program potential, and
   wherein the operational amplifier supplied with the second program potential outputs a signal including variations of the operational amplifier to the second output terminal without being influenced by variations included in the second signal.

7. The receiving circuit according to claim 5, wherein the operational amplifier comprises a fourth transistor, and wherein a semiconductor layer of the first transistor and a semiconductor layer of the fourth transistor comprise the same material.

8. The receiving circuit according to claim 1, wherein the receiving circuit further comprises a third transistor, wherein the operational amplifier further comprises a second output terminal, wherein one of a source and a drain of the third transistor is electrically connected to the third node, wherein the second signal is supplied to the third element, wherein a second program potential is supplied to the third node through the third transistor, wherein variations included in the second signal are stored in the third element in accordance with the second program potential, and wherein the operational amplifier supplied with the second program potential outputs a signal including variations of the operational amplifier to the second output terminal without being influenced by variations included in the second signal.

9. The receiving circuit according to claim 8, wherein the operational amplifier comprises a fourth transistor, and wherein a semiconductor layer of the first transistor and a semiconductor layer of the fourth transistor comprise the same material.

10. The receiving circuit according to claim 1, wherein the operational amplifier comprises a fourth transistor, and wherein a semiconductor layer of the first transistor and a semiconductor layer of the fourth transistor comprise the same material.

11. The receiving circuit according to claim 10, wherein the first transistor comprises metal oxide in the semiconductor layer.

12. The receiving circuit according to claim 1, wherein the first transistor comprises metal oxide in a semiconductor layer.

\* \* \* \* \*